United States Patent [19]
Kitsukawa et al.

[11] Patent Number: 6,067,257
[45] Date of Patent: May 23, 2000

[54] SEMICONDUCTOR INTEGRATED CIRCUIT DEVICE HAVING STEP-DOWN VOLTAGE CIRCUIT

[75] Inventors: Goro Kitsukawa, Hinode-machi; Yoji Idei, Asaka, both of Japan

[73] Assignee: Hitachi, Ltd., Tokyo, Japan

[21] Appl. No.: 09/270,677

[22] Filed: Mar. 16, 1999

[30] Foreign Application Priority Data

Mar. 16, 1998 [JP] Japan .................................. 10-084925

[51] Int. Cl.[7] .................................................. G11C 7/00
[52] U.S. Cl. ................................ 365/189.11; 365/189.09
[58] Field of Search ........................ 365/189.11, 189.09, 365/189.12, 233; 327/390, 589

[56] References Cited

U.S. PATENT DOCUMENTS 5,905,685  5/1999  Nakamura et al. ...................... 365/207

FOREIGN PATENT DOCUMENTS 9-270191  10/1997  Japan .

*Primary Examiner*—David Nelms
*Assistant Examiner*—David Lam
*Attorney, Agent, or Firm*—Antonelli, Terry, Stout & Kraus, LLP

[57] ABSTRACT

A semiconductor integrated circuit device is provided with an internal circuit which receives a source voltage supplied from an external terminal and is activated based on a voltage obtained by reducing the source voltage, and an output circuit which outputs a signal to be outputted produced by the internal circuit, through an external terminal in accordance with a timing signal. In the semiconductor integrated circuit device, a level shift circuit converts the signal produced by the internal circuit to a signal level corresponding to the level of the source voltage supplied from the external terminal. The output circuit outputs the level-shifted signal therefrom using a timing signal of a voltage level corresponding to the source voltage supplied from the external terminal.

15 Claims, 12 Drawing Sheets

NAND (G3)

NOR (G4)

SEMICONDUCTOR INTEGRATED CIRCUIT DEVICE HAVING STEP-DOWN VOLTAGE CIRCUIT

BACKGROUND OF THE INVENTION

The present invention relates to a semiconductor integrated circuit device; and, more particularly, the invention relates to a technique which is effective for use in both an output-system circuit of the type which is employed in a semiconductor memory, such as a dynamic RAM (Random Access Memory), wherein an internal circuit is principally activated based on a reduced voltage, and a logic-in level shift circuit employed in the output-system circuit.

In a highly integrated semiconductor memory, a system for activating an internal circuit based on a voltage which has been stepped-down or reduced from an external source voltage has been widely used to ensure reliability of a micro-fabricated device and to reduce the power consumption thereof. Japanese Patent Application Laid-Open No. Hei 9-270191 discloses an example of a dynamic RAM equipped with such a de-boosting circuit.

SUMMARY OF THE INVENTION

When an internal circuit of the type mentioned above is activated based on a reduced voltage, it is necessary to allow an output circuit to perform a level-shifting or level-converting (amplifying) operation at a preceding stage and cause an input/output interface to meet with desired specifications. When, in this case, the output circuit performs an output operation according to a timing signal, such as a clock signal or the like, it is reduced in operation speed by the level-shifting or level-converting operation. Since, for example, a synchronous DRAM or the like, which is capable of obtaining an output signal synchronized with a clock signal, needs to reduce the delay time tAC of the timing provided to output a signal with respect to the clock signal to about 5 ns, the time spent in the level conversion processing is by no means negligible. When it is desired to make the de-boosted voltage smaller with a view toward providing low power consumption and high device reliability or the like with developments in the micro-fabricated device, the time spent in level shifting becomes much longer. Therefore, the delay of the signal in the level-shifting operation becomes an important problem to the semiconductor integrated circuit device of such a type that the internal circuit is activated based on the de-boosted voltage.

An object of this invention is to provide a semiconductor integrated circuit device which is capable of implementing the speeding-up of its operation while achieving low power consumption and high device reliability.

Another object of this invention is to provide a semiconductor integrated circuit device which activates an internal circuit based on a reduced voltage and transmits an output signal in synchronism with a clock signal.

A further object of this invention is to provide a semiconductor integrated circuit device which is equipped with a logic-in level shift circuit formed to have a simple configuration.

The above and other objects, and novel features of this invention will become more apparent from the following description in the present specification and the accompanying drawings.

A summary of a typical one of the features of the invention as disclosed in the present application will be briefly described as follows: In a semiconductor integrated circuit device provided with an internal circuit which receives a source voltage supplied from an external terminal and is activated based on a voltage obtained by reducing or de-boosting the source voltage, and an output circuit for outputting a signal to be outputted as produced by the internal circuit, through an external terminal in accordance with a timing signal, the signal to be outputted as produced by the internal circuit is converted to a signal level corresponding to the voltage level supplied from the external terminal by a level shift circuit. Thereafter, the level-shifted signal is outputted from the output circuit using a timing signal of a voltage level corresponding to the source voltage supplied from the external terminal.

A summary of another typical one of the features of the present invention as disclosed in the present application will be briefly described as follows: A semiconductor integrated circuit device comprises an internal circuit which receives a source voltage supplied from an external terminal and is activated based on a voltage obtained by reducing the source voltage, and a logic unit for performing logic processing on a first signal produced by the internal circuit and a second signal corresponding to the source voltage supplied from the external terminal, each of which is comprised of first and second N channel MOSFETs for complementarily performing a switch operation according to the first signal, first and second P channel MOSFETs provided between the drains of the first and second N channel MOSFETs and the source voltage supplied from the external terminal and whose gates and drains are electrically cross-connected to one another, a third N channel MOSFET which receives the second signal at the gate thereof and is electrically connected in series (or parallel) to one of the pair of N channel MOSFETS, whose drain is electrically connected to an output terminal, and a third P channel MOSFET which receives the second signal at the gate thereof and is electrically connected in parallel (or series) to one of the cross-connected P channel MOSFETS, whose drain is electrically connected to the output terminal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description, which is to be taken in connection with the accompanying drawings in which:

DETAILED DESCRIPTION OF THE INVENTION

Preferred embodiments of the invention will hereinafter be described in detail with reference to the accompanying drawings.

Figure 1:
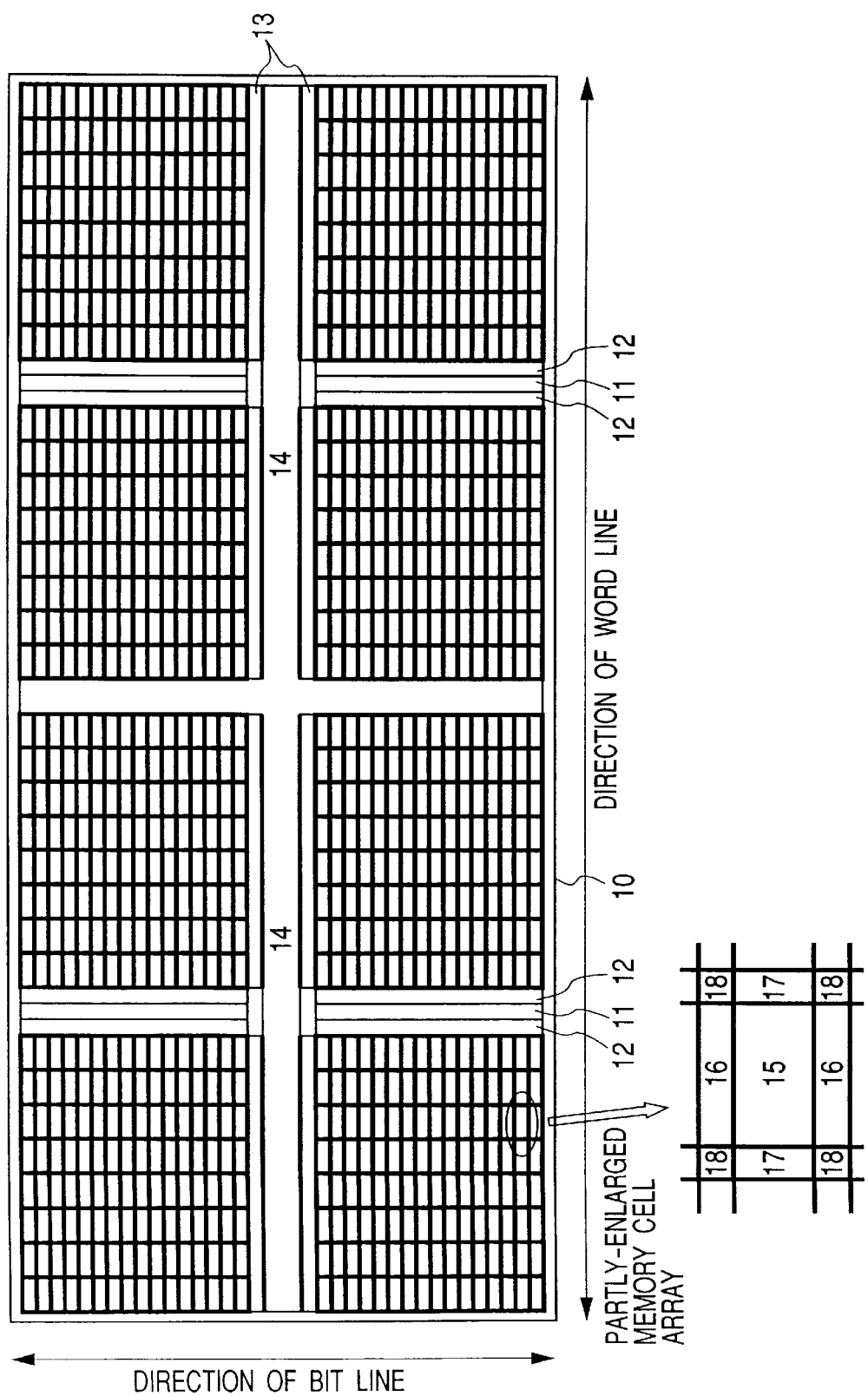
FIG. 1 is a schematic layout diagram showing one embodiment of a dynamic RAM to which the present invention is applied.

FIG. 1 is a schematic layout diagram showing one embodiment of a dynamic RAM to which this invention is applied. Of respective circuit blocks constituting the dynamic RAM to which the present invention is applied, a principal portion related to the invention is shown in the drawing, as will be understood therefrom. It is formed on a single semiconductor substrate like monocrystal silicon by a known method of manufacturing a semiconductor integrated circuit.

In the present embodiment, the memory is divided into four memory arrays as a whole, although the invention is not restricted this regard. An address input circuit, a data input/output circuit, an input/output interface circuit comprised of a row of bonding pads, and a power circuit including a step-down or voltage reduction circuit, etc. are provided in central portions 14 arranged with respect to the longitudinal direction of a semiconductor chip. Column decoder areas 13 are respectively placed in portions contiguous to the memory arrays located on both sides of these central portions 14.

In the respective memory arrays, of which there are four divided into two memory arrays on both sides and two memory arrays arranged up and down with respect to the longitudinal direction of the semiconductor chip, as described above, main row decoder areas 11 are provided in upper and lower central portions with respect to the longitudinal direction of the semiconductor chip. Main word driver areas 12 are respectively formed above and below the main row decoder areas 11 so as to drive main word lines for the memory arrays that are divided into upper and lower parts.

The memory cell array (sub-array) 15 is formed so as to be surrounded by sense amplifier areas 16 and sub-word driver areas 17 with the memory cell array 15 interposed therebetween, as illustrated by the enlarged view. Portions where the sense amplifier areas 16 and the sub-word driver areas 17 intersect are called intersecting areas (cross areas) 18. Sense amplifiers provided in the sense amplifier areas 16 are constructed in accordance with a shared-sense system. Complementary bit lines are respectively provided on both sides of the sense amplifiers with the sense amplifiers at the centers, except for the sense amplifiers placed at both ends of the memory cell arrays. The sense amplifiers are selectively connected to their corresponding complementary bit lines for either one of the side-to-side memory cell arrays.

As described above, the memory arrays which are separated by four on either side with respect to the longitudinal direction of the semiconductor chip are placed in pairs, two-by-two. The two memory arrays arranged in two-by-two pairs in this way are constructed such that the main row decoder areas 11 and the main word driver areas 12 are respectively placed in their central portions. Each main word driver area 12 forms or produces a signal for selecting a main word line which extends so as to penetrate one memory array referred to above. Further, sub-word selection drivers are also provided in the main word driver areas 12. As will be described later, each sub-word selection driver extends in parallel to the main word line and produces a signal for selecting a sub-word select line.

One memory cell array (sub-array) 15, as shown in the enlarged view, comprises 256 sub-word lines and complementary bit lines (or data lines) orthogonal thereto, which are provided as 256 pairs, although they are not shown in the drawing. Since the sixteen memory cell arrays (sub-arrays) 15 are provided in a bit line direction in one memory array described above, about 4K sub-word lines are provided as a whole. On the other hand, since the eight memory cell arrays are provided in a word line direction, about 2K complementary bit lines are provided as a whole. Since eight such memory arrays are provided as a whole, the chip has a storage capacity of 8×2K×4K=64 Mbits in all.

As above-described, one memory array is divided into eight with respect to the direction of the main word line. Sub-word drivers (sub-word line driving circuits) 17 are provided for every one of the memory cell arrays 15 divided in this way. The sub-word drivers 17 are respectively divided into lengths of one-eighth the main word line.

Each individual sub-word driver 17 produces a signal for selecting the corresponding sub-word line extending in parallel thereto. In the present embodiment, four sub-word lines are arranged for each main word line in a complementary bit-line direction to decrease the number of main word lines, in other words, to reduce the wiring pitch of each main word line, although the invention is not restricted in this regard. Thus, a sub-word selection driver is provided to select one sub-word line from the eight sub-word lines divided in the main word-line direction and is assigned in the complementary bit-line direction by four. This sub-word selection driver produces a signal for selecting one from the four sub-word select lines which extend in the direction of an arrangement of the sub-word drivers.

If attention is paid to one memory array referred to above, then one-by-one sub-word lines are selected from all of the eight memory cell arrays assigned to one main word line. Since there are 2K (2048) memory cells in the main word-line direction as described above, 2048/8=256 memory cells are electrically connected to one sub-word line.

As described above, each memory array has a storage capacity of 4 Kbits with respect to the complementary bit-line direction. However, if an equivalent of 4K memory cells are electrically connected to each complementary bit line, then the parasitic capacity of each complementary bit line increases and a signal level being read, based on the capacity ratio of the above capacity to the capacitance of a micro information storage capacitor, is not obtained. Therefore, the memory array is divided into sixteen even with respect to the complementary bit-line direction. That is, the complementary bit lines are divided into sixteen by the sense amplifiers 16 indicated by thick black lines. Although the invention is not restricted in particular, the sense amplifiers 16 are constructed in accordance with the shared-sense system. The complementary bit lines are respectively provided on both sides of the sense amplifiers with the sense amplifiers 16 as the centers, except for the sense amplifiers 16 placed at both ends of the memory cell arrays. The sense amplifiers 16 are selectively connected to their corresponding complementary bit lines for either one of the side-to-side memory cell arrays.

Figure 2:
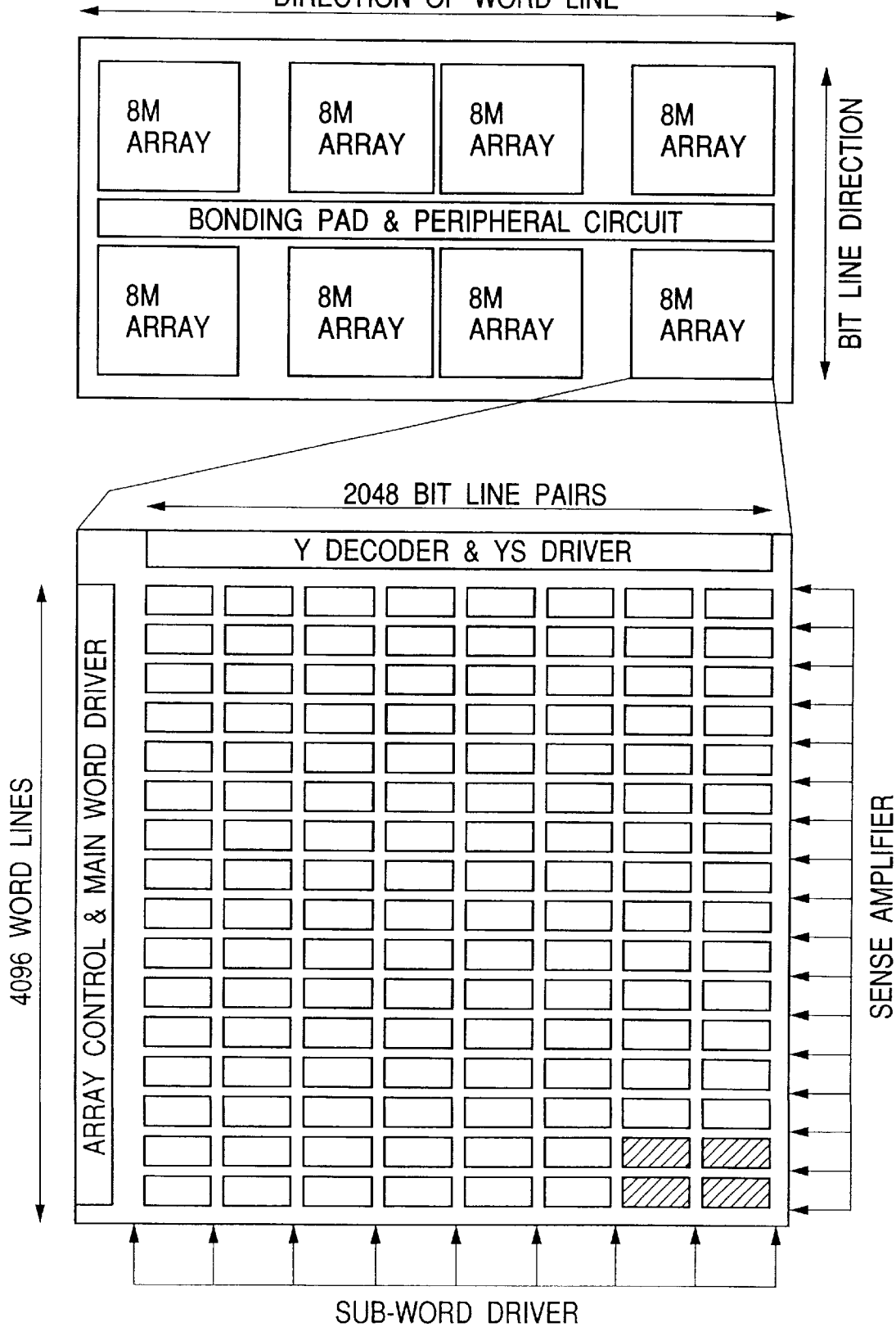
FIG. 2 is a schematic layout diagram for describing a dynamic RAM to which the present invention is applied.

FIG. 2 is a schematic layout diagram for illustrating the dynamic RAM to which the present invention is applied. The drawing shows a schematic layout of the entire memory chip and a layout of one memory array divided into eight parts. The drawing is one in which the embodiment shown in FIG. 1 is illustrated from another point of view. That is, the memory is divided into four memory arrays from side to side with respect to the longitudinal direction (word line direction) of the memory chip and memory arrays arranged upward and downward in a manner similar to FIG. 1. The memory arrays (Array) are eight in number, and indirect peripheral circuits (Bonding Pad & peripheral Circuit) such as a plurality of bonding pads and address buffers, control circuits, pre-decoders and timing control circuits, etc. are provided in a central portion extending in the longitudinal direction thereof.

Each of the eight memory arrays has a storage capacity of about 8 Mbits. As one of them is illustrated in an enlarged form, eight sub-arrays arranged in the word line direction and sixteen sub-arrays arranged in the bit line direction are provided in each memory array. Sense amplifiers (Sense Amplifiers) are respectively arranged on both sides in the bit line direction of each sub-array along the bit line direction. Sub-word drivers (Sub-Word Drivers) are respectively arranged on both sides in the word line direction of each sub-array.

Each individual memory array is provided with 4096 word lines and complementary bit lines set in 2048 pairs as a whole. Thus, each memory array has a storage capacity of about 8 Mbits in total. Since the 4096 word lines are arranged for the sixteen sub-arrays in divided form as described above, 256 word lines (sub-word lines) are provided for each sub-array. Since the 2048 pairs of complementary bit lines are arranged for the eight sub-arrays in divided form as described above, 256 pairs of complementary bit lines are provided for each sub-array.

A main row decoder, an array control circuit and a main word driver are provided at the central portion between the two arrays. The array control circuit includes a driver for driving a first sub-word select line. Each main word line extended so as to penetrate the eight sub-arrays is provided in the memory array. The main word driver drives the main word line. Similarly to the main word line, the first sub-word select line is also extended so as to penetrate the eight sub-arrays. A Y decoder (YDecoder) and a Y select line driver (YSdriver) are provided at an upper portion of the memory array.

Figure 3:
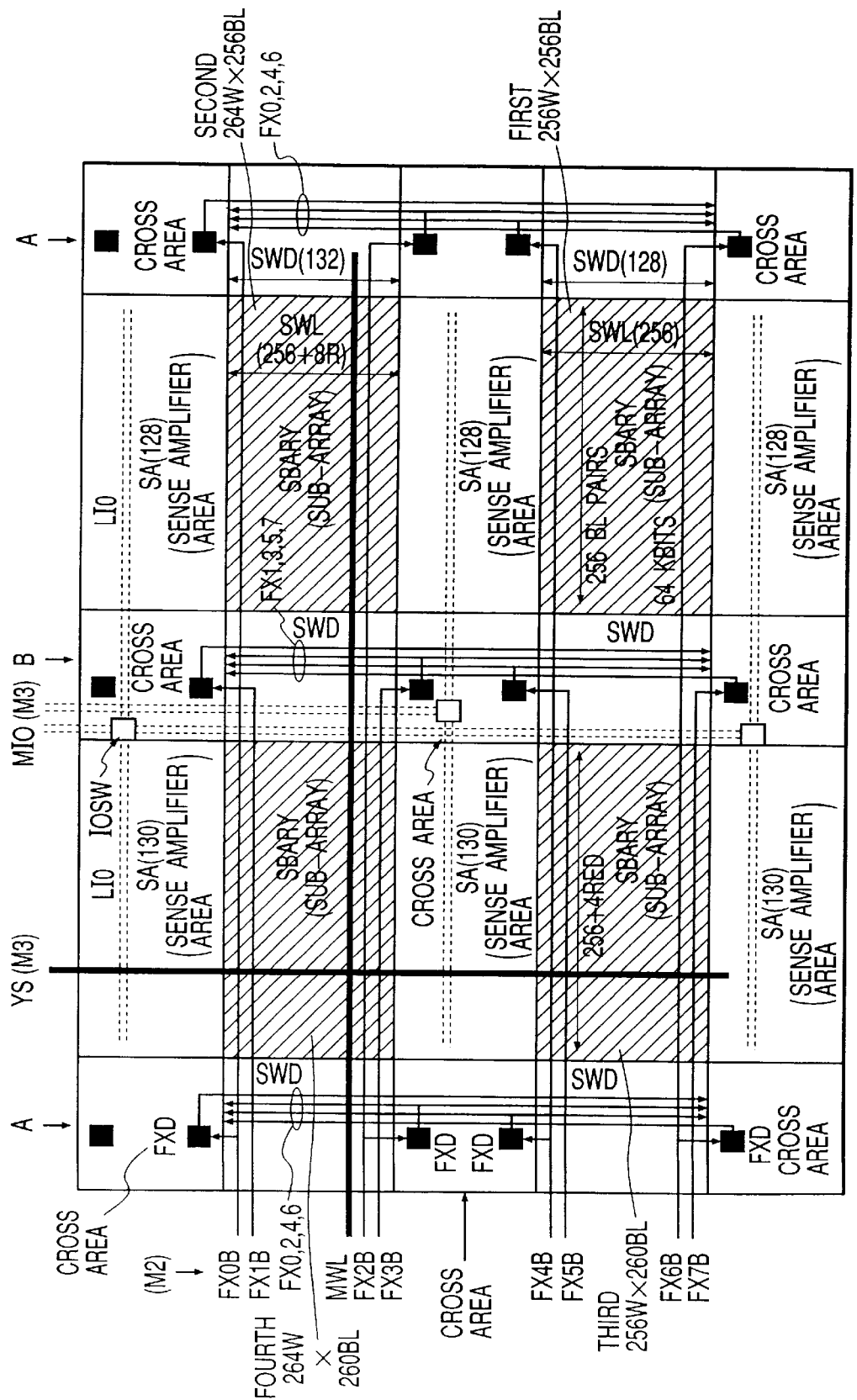
FIG. 3 is a schematic layout diagram illustrating embodiments of sub-arrays and their peripheral circuits employed in the dynamic RAM according to the present invention.

FIG. 3 schematically illustrates the layout of the embodiments of sub-arrays and their peripheral circuits employed in the dynamic RAM according to the present invention. Four sub-arrays SBARY disposed in diagonally-shaded positions in the memory array shown in FIG. 2 are illustrated in the drawing as typical ones. In FIG. 3, areas to form the sub-arrays SBARY are diagonally shaded to distinguish sub-word driver areas, sense amplifier areas and cross areas from one another, which are provided around the areas where the sub-arrays SBARY are formed.

The sub-arrays SBARY are classified into the following four types. That is, if the direction of an extension of each word line is defined as the horizontal direction, then the first sub-array SBARY placed below on the right comprises 256 sub-word lines SWL and 256 pairs of complementary bit lines. Therefore, 256 sub-word drivers SWD corresponding to the 256 sub-word lines SWL are placed on both sides of the first sub-array SBARY by 128 in divided form. 256 sense amplifiers SA provided so as to correspond to the 256 pairs of complementary bit lines BL are configured in accordance with the abovedescribed shared sense amplifier system and are placed in alternate order, and they are placed on the upper and lower sides of the first sub-array SBARY by 128 in divided form.

Although the invention is not restricted in particular, the second sub-array SBARY placed above on the right is provided with eight spare (redundant) word lines in addition to 256 normal sub-word lines SWL and comprises 256 pairs of complementary bit lines. Therefore, 264 sub-word drivers SWD associated with the above 256+8 sub-word lines SWL are placed on both sides of such a sub-array, with 132 in divided form on each side. Sense amplifiers are arranged up and down, with 128 on each side in the same manner as described above. That is, the 128 pairs of complementary bit lines of 256 pairs, which are formed in the sub-arrays SBARY arranged at the up-and-down positions of the right side, are connected in common to the sense amplifier SA interposed therebetween through shared switches MOSFETS.

The third sub-array SBARY placed below on the left c6mprises 256 sub-word lines SWL in a manner similar to the sub-array SBARY adjacent thereto on the right side thereof. In the same manner as described above, 128 sub-word drivers are placed in divided form. 128 sub-word lines SWL of the 256 sub-word lines in the sub-arrays SBARY placed from side to side as seen on the lower side are electrically connected in common to 128 sub-word drivers SWD formed in a region or area interposed therebetween. The sub-array SBARY placed below on the left as described above is provided with four pairs of spare (redundant) bit lines 4RED in addition to 256 pairs of normal complementary bit lines BL. Therefore, 260 sense amplifiers SA corresponding to the 260 pairs of complementary bit lines BL are arranged on the upper and lower sides of such a sub-array, with 130 in divided form on each side.

The fourth sub-array SBARY placed above on the left is provided with 256 normal sub-word lines SWL and eight spare sub-word lines in a manner similar to the sub-array SBARY adjacent thereto on the right side thereof. Further, the fourth sub-array SBARY is provided with four pairs of spare bit lines in addition to 256 pairs of normal complementary bit lines in a manner similar to the subarray adjacent thereto on the side therebelow. Therefore, subword drivers are placed on the left and right sides, with 132 in divided form on each side, and sense amplifiers SA are arranged up and down, with 130 in divided form on each side.

A main word line MWL is extended in the horizontal direction as described above and as illustratively shown as a typical example. Further, a column select line YS is extended in the vertical direction as illustratively shown as a typical example. The sub-word lines SWL are placed in parallel with the main word line MWL, and complementary bit lines BL (not shown) are arranged in parallel with the column select line YS. In the present embodiment, although the invention is not restricted in particular, eight sets of sub-arrays by the four sets of sub-arrays are respectively configured in the bit line and word line directions in the 8-Mbit memory array, as shown in FIG. 2, with four sub-arrays serving as one set for the basic unit. Since four sub-arrays are provided for each set, subarrays corresponding to 128=8×4×4 sub-arrays are provided within the 8-Mbit memory array.

Since the overall chip has eight 8-Mbit memory arrays, sub-arrays corresponding to 1024=128×8 sub-arrays are formed in the entire memory chip.

Eight sub-word select lines FX0B through FX7B with respect to the four sub-arrays are extended so as to penetrate or pass through the four sets of (eight) subarrays in a manner similar to the main word line MWL. Further, the four sub-word select lines FX0B through FX3B and the four sub-word select lines FX4B through FX7B are extended on the up-and-down sub-arrays in parts. Thus, the reason why one set of sub-word select lines FX0B through FX7B are assigned to the two sub-arrays and are allowed to extend on the sub-arrays, is to reduce the memory chip in size.

That is, when the eight sub-word select lines FX0B through FX7B are assigned to their corresponding sub-arrays and arranged in the form of wiring channels on the sense amplifier areas, eight wiring channels corresponding to 8×32=256 are necessary for the 32 sense amplifiers extending in the transverse direction as in the memory arrays shown in FIG. 1. In the aforementioned embodiment on the other hand, the interconnections or wires themselves can form the wiring channels without the provision of special wiring-dedicated areas by assigning the eight sub-word select lines FX0B through FX7B to the up-and-down arranged two sub-arrays in common and placing them over the sub-arrays in parallel with the main word line in mixed form with respect to each other.

To begin with, one main word line is provided on the sub-arrays for the eight sub-word lines, and the subword select lines for selecting one of the eight subword lines are needed. The wiring pitch of each main word line MWL is loosened because the main word line MWL is formed in the proportions of one main word line to the eight sub-word lines SWL formed according to the pitch of each memory cell. Thus, the sub-word select lines can be formed between the main word lines with relative ease with a mere small sacrifice of the looseness of the wiring pitch by utilizing a wired layer identical to the main word line MWL.

Each of the sub-word drivers SWD employed in the present embodiment has such a configuration that it operates to select one sub-word line SWL by using a select signal supplied through the sub-word select line FX0B or the like and a select signal obtained by inverting the select signal. The sub-word driver SWD has such a configuration that it operates to simultaneously select the sub-word lines SWL for the sub-arrays arranged on both sides with each sub-word driver SWD as the center. Therefore, the four sub-word select lines are distributively provided for the 128×2=256 sub-word drivers for the two sub-arrays sharing FX0B or the like thqrebetween as described above. That is, if attention is paid to the sub-word select line FX0B, it is then necessary to supply a select signal to each of the 256÷4=64 sub-word drivers SWD for the two sub-arrays.

If one line extending in parallel to the main word line MWL is defined as the first sub-word select line FX0B, then each second sub-word line FX0 for supplying a select signal to each of the vertically-arranged 64 sub-word drivers through each of sub-word select line driver circuits FXD, which is provided in the cross area located at the left upper portion and receives a select signal from the first sub-word select line FX0B, is provided. The first sub-word select line FX0B is extended in parallel to the main word line MWL and the sub-word lines SWL, whereas the second sub-word select lines are extended over sub-word driver areas in parallel with the column select line YS and complementary bit lines BL orthogonal thereto. In a manner similar to the eight first sub-word select lines FX0B through FX7B, the second sub-word select lines FX0 through FX7 are also divided into even numbered lines FX0, 2, 4 and 6 and odd numbered lines FX1, 3, 5 and 7, which in turn are arranged so as to be distributed to the sub-word drivers SWD provided on both sides of each sub-array SBARY.

The sub-word select line driver circuits FXD are placed so as to be distributed to the upper and lower sides of one cross-hatched area as indicated by ■ in the drawing. That is, in the cross area located at the left upper portion as described above, the sub-word select line driver circuit disposed on the lower side thereof corresponds to the first sub-word select line FX0B. Further, the two sub-word select line driver circuits FXD provided in the cross area located at the left intermediate portion correspond to the first sub-word select lines FX2B and FX4B, respectively. Moreover, the sub-word select line driver circuit provided in the left-lower cross area and located on the upper side thereof corresponds to the first sub-word select line FX6B.

In the cross area located at the central upper portion, the sub-word select line driver circuit disposed on the lower side thereof corresponds to the first sub-word select line FXLB. The two sub-word select line driver circuits FXD provided in the cross area located at the central intermediate portion are associated with the first sub-word select lines FX3B and FX5B respectively. The sub-word select line driver circuit provided in the cross area at the central lower portion and disposed on the upper side thereof corresponds to the first sub-word select line FX7B. In the cross area provided at the right upper portion, the sub-word select line driver circuit disposed on the lower side thereof corresponds to the first sub-word select line FX0B. The two sub-word select line driver circuits FXD provided in the cross area located at the right intermediate portion are associated with the first sub-word select lines FX2B and FX4B respectively. The sub-word select line driver circuit provided in the cross area at the right lower portion and disposed on the upper side thereof corresponds to the first sub-word select line FX6B. Thus, the sub-word drivers provided at the end of each memory array drive only the sub-word lines SWL provided on the left side alone because no sub-arrays exist on the right sides thereof.

As in the present embodiment, the placement of the sub-word select lines FXB within a clearance of the pitch for main word line MWL on the sub-arrays can eliminate for the need for the special wiring channels. Therefore, even if the eight sub-word select lines are placed on one sub-array, the memory chip does not increase in size. However, the cross areas increase in area because the above-described sub-word select line driver circuits FXD are formed, thus resulting in interference with high integration of the memory chip. This is because each cross area referred to above has no real allowance due to the formation of peripheral circuits, such as switch circuits IOSW provided so as to correspond to main input/output lines MIO and local input/output lines LIO, indicated by broken lines in the drawing, power MOSFETs for respectively driving the sense amplifiers, driver circuits for driving the shared switch MOSFETS, and driver circuits for driving precharge MOSFETS, etc. Therefore, in the embodiment shown in FIG. 3, the sub-word select line driver circuit FDX is shared between the upper and lower two sub-arrays to reduce the increase in area.

Of the above-described cross areas, those placed in the extending direction A of the second sub-word select lines FXO through FX6 corresponding to the even numbered lines include N channel type power MOSFETs Q16 for respectively supplying a stabilized internal voltage VDL to the sense amplifiers, N channel type power MOSFETs Q15 for respectively supplying an overdriving source voltage VDD to the sense amplifiers, and N channel type power MOSFETs 014 for respectively supplying a circuit ground potential VSS to the sense amplifiers.

Of the above-described cross areas, those placed in the extending direction B of the second sub-word select lines FX1 through FX7 corresponding to the odd numbered lines include inverter circuits for respectively bringing precharge and equalize MOSFETs for the bit lines to an off state, and N channel type power MOSFETs for respectively supplying a circuit ground potential VSS to the sense amplifiers, although the invention is not restricted in this regard. Each of the N channel type power MOSFETs supplies the ground potential from both sides of the sense amplifier row to a common source line (CSN) of each amplification MOSFET of the N channel @ype MOSFETs constituting the sense amplifiers. That is, both the N channel type power MOSFET provided in each cross area on the A side and the N channel type power MOSFET provided in each cross area on the B side supply the ground potential to the 128 or 130 sense amplifiers provided in each sense amplifier area.

As described above, each sub-word line driver circuit SWD selects the sub-word lines for the sub-arrays on both sides thereof with the sub-word line driver circuit SWD as the center. On the other hand, the two sense amplifiers provided on both sides are activated in association with the selected sub-word lines for two sub-arrays. This is because, when the corresponding sub-word line is placed in a selected state, an address selection MOSFET is brought to an on state so that the electrical charge stored in a storage capacitor is combined with the electrical charge on each bit line, whereby the need for performing a re-write operation for activating the sense amplifiers so as to restore the storage capacitor to the original charged state arises. Therefore, the power MOSFETs are used to activate the sense amplifiers on both sides with the power MOSFETs interposed therebetween, exclusive of those corresponding to each sub-array at is the above-described end. On the other hand, since each sub-word line driver circuit SWD provided on the right or left side of the sub-array, which is placed at the end of a sub-array group, selects only the sub-word line for each sub-array, the power MOSFETs activate only one-side sense amplifier group corresponding to the sub-arrays.

The sense amplifiers are configured in accordance with the shared-sense system. Each shared switch MOSFET corresponding to the complementary bit lines on the non-selected side of the sub-word lines, of the sub-arrays placed on both sides with each sense amplifier interposed therebetween, is turned off and thereby disconnected from the corresponding sense amplifier, whereby the re-write operation for amplifying a signal read from the complementary bit line pair corresponding to the selected sub-word line and for restoring the storage capacitor of each memory cell to the original charged state is performed.

Figure 4:
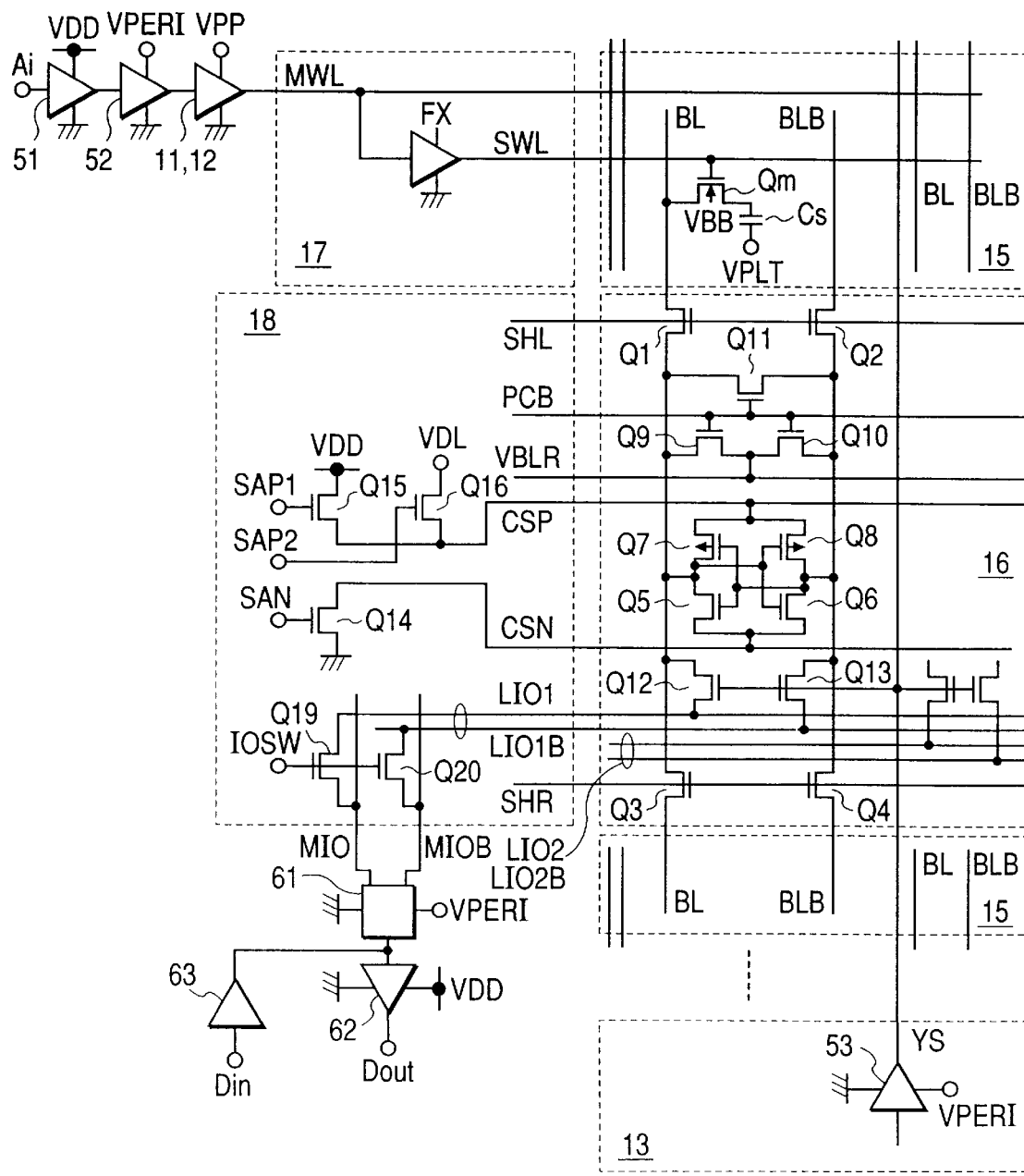
FIG. 4 is a schematic circuit diagram showing one simplified embodiment of a sense amplifier portion from the input of addresses to the output of data, of the dynamic RAM according to the present invention, with the sense amplifier portion as the central figure.

FIG. 4 is a circuit diagram showing one simplified embodiment of a sense amplifier portion, from the input of addresses to the output of data, of the dynamic RAM according to the present invention, with the sense amplifier portion being shown as the central figure. A sense amplifier 16 provided so as to be interposed between two sub-arrays 15 arranged above and below, and a circuit provided within the cross area 18 are illustratively shown in the same drawing and others are shown as block diagrams. Further, circuit blocks indicated by dotted lines are respectively indicated by the above-described signs.

One dynamic memory cell, provided between a sub-word line SWL and one, i.e., bit line BL of the complementary bit lines BL and BLB provided in one sub-array 15 referred to above, is illustratively shown as a typical example. The dynamic memory cell comprises an address selection MOSFET Qm and a storage capacitor Cs. The gate of the address selection MOSFET Qm is electrically connected to the sub-word line SWL, the drain thereof is electrically connected to the bit line BL and the source thereof is electrically connected to the storage capacitor Cs. The other electrode of the storage capacitor Cs is used in common and is supplied with a plate voltage VPLT. A negative back bias voltage VBB is applied to a substrate (channel) of the MOSFET Qm. A level for selecting the sub-word line SWL is set to a high voltage VPP raised by a threshold voltage of the address selection MOSFET Qm from a high level on the bit line.

When each sense amplifier is activated by an internal de-boosted or stepped-down voltage VDL, a high level amplified by the sense amplifier and supplied to the corresponding bit line is brought to the internal voltage VDL level. Thus, the high voltage VPP corresponding to the selection level for the word line is set to VDL+Vth+a. A pair of complementary bit lines BL and BLB placed in the sub-array provided on the left side of the sense amplifier are arranged in parallel as shown in the drawing and are allowed to suitably intersect as needed to maintain a capaqity balance between the bit lines, for example. The complementary bit lines BL and BLB are electrically connected to their corresponding input/output nodes of a unit circuit of the sense amplifier through shared switch MOSFETs Q1 and Q2.

The unit circuit of the sense amplifier comprises N channel type amplification MOSFETs Q5 and Q6 and P channel type amplification MOSFETs Q7 and Q8 whose gates and drains are respectively cross-connected to one another so that they may be brought into a latch form. The sources of the N channel type MOSFETs Q5 and Q6 are electrically connected to a common source line CSN. The sources of the P channel type MOSFETs Q7 and Q8 are electrically connected to a common source line CSP. Power switch MOSFETs are respectively electrically connected to the common source lines CSN and CSP. Although the invention is not restricted in particular, the common source line CSN electrically connected to the sources of the N channel type amplification MOSFETs Q5 and Q6 is supplied with an operating voltage corresponding to ground potential by an N channel type power switch MOSFET Q14 provided in the cross area 18.

An overdriving N channel type power MOSFET Q15 provided in the cross area 18 and an N channel type power MOSFET Q16 for supplying the internal voltage VDL are provided so as to be electrically connected to the common source line CSP to which the sources of the P channel type amplification MOSFETs Q7 and Q8 are electrically connected. A source voltage VDD supplied from an external terminal is used as a voltage for the overdriving MOSFET, although the invention is not restricted in this regard. Alternatively, in order to reduce the dependency of a sense amplifier operating velocity on the source voltage VDD, each MOSFET may be constructed such that a stepped-up or boosted voltage VPP is applied to the gate of each MOSFET, the drain thereof is electrically connected to the source voltage VDD and the above-described voltage, de-boosted slightly with respect to the source voltage VDD, is obtained from the source thereof.

A sense amplifier overdriving activation signal SAP1 supplied to the gate of the N channel type power MOSFET Q15 is defined as a signal in phase with an activation signal SAP2 supplied to the gate of the N channel type MOSFET Q16. The signals SAP1 and SAP2 are respectively brought to a high level on a time-sequence basis. Although the invention is not restricted in particular, the high levels of the signals SAP1 and SAP2 are respectively defined as having a boosted voltage VPP level. That is, since the boosted voltage VPP is about +3.8 V, the N channel type MOSFETs Q15 and Q16 can be brought to an on state sufficiently. After the MOSFET Q15 is brought to an off state, the MOSFET Q16 is turned on so that a voltage corresponding to the internal voltage VDL is outputted from the source side thereof.

A precharge circuit comprised of an equalize MOSFET Q11 for short-circuiting the complementary bit lines and switch MOSFETs Q9 and Q10 for supplying a half precharge voltage VBLR to the complementary bit lines is provided at the input/output nodes of the unit circuit of the sense amplifier. The gates of these MOSFETs Q9 through Q11 are supplied with a precharge signal PCB in common. With respect to a driver circuit for forming or producing the precharge signal PCB, an inverter circuit is provided in the cross area to make the falling edge of the precharge signal fast, although this is not shown in the drawing. In other words, prior to the timing for selecting the corresponding word line upon the start of a memory access, each of the MOSFETs Q9 through Q11 constituting the precharge circuit is switched or selected at a high speed through each of the inverter circuits provided in distributed form in the respective cross areas.

The cross area 18 also includes a half precharge circuit used for each of the common source lines CSP and CSN for each sense amplifier, a half precharge circuit for each local input/output line LIO, a dispersive driver circuit for each of shared select signal lines SHR and SHL, etc. other than the circuits shown in FIG. 4.

The unit circuit of the sense amplifier is electrically connected to similar complementary bit lines BL and BLB of the sub-array 15 provided on the lower side in the drawing through shared switch MOSFETs Q3 and Q4. The switch MOSFETs Q12 and Q13 constitute a column switch circuit. When the select signal YS is set to a select level (high level), they are turned on so that the input/output nodes of the unit circuit of the sense amplifier and the local input/output lines LIO1, LIO1B, LIO2, LIO2B, etc. are electrically connected to one another. When the sub-word line SWL of the sub-array on the upper side is selected, for example, the shared switch MOSFETs Q1 and Q2 on the upper side of the sense amplifier are held on and the shared switch MOSFETs Q3 and Q4 on the lower side thereof are turned off.

Thus, the input/output nodes of the sense amplifier are electrically connected to the complementary bit lines B1, and BLB on the upper side so that a small signal of the memory cell electrically connected to the selected sub-word line SWL is amplified. Thereafter, the amplified signal is transmitted to the local input/output lines LIOI and LIO1B through the column switch circuit (Q12 and Q13). The local input/output lines LI01 and LI01B are electrically connected to the main input/output lines MIO and MIOB connected to an input terminal of a main amplifier 61 through a switch circuit IOSW comprised of N channel type MOSFETs Q19 and Q20 provided in the cross area 18. While omitted in the drawing, the provision of a so-called analog gate provided with P channel type MOSFETs in parallel with the MOSFETs Q19 and Q20 allows a further speeding-up. The use of the boosted voltage VPP as the voltage applied to the gates of the MOSFETs Q19 and Q20 allows a decrease in on-resistance and a speeding-up. While omitted in the drawing, output terminals of a write amplifier are also electrically connected to the main input/output lines MIO and MIOB.

Although the invention is not restricted in particular, the column switch circuit connects the two pairs of complementary bit lines BL and BLB to the two pairs of local input/output lines LI01, LI01B and LI02 and LI02B in response to one select signal YS. Therefore, the complementary bit lines of four pairs in total are selected by the two pairs of column switch circuits provided in association with one pair of sense amplifiers provided on both sides of the corresponding sub-array selected by the selecting operation of one main word line. Therefore, 4-bit simultaneous reading/writing can be performed in response to one YS selection.

An address signal Ai is supplied to an address buffer 51. The address buffer 51 is activated on a timeshared basis to take in or capture an X address signal and a Y address signal. The X address signal is supplied to a predecoder 52 so that a select signal for a main word line MWL is formed through a main row decoder 11 and a main word driver 12. Since the address buffer 51 receives the address signal Ai supplied from an external terminal therein, it is activated based on the source voltage VDD supplied from the external terminal. The predecoder 52 is activated based on a de-boosted voltage VPERI, and the main word driver 12 is activated based on the boosted voltage VPP. A column decoder (driver) 53 forms or produces the column select signal YS in response to the Y address signal supplied according to the time-sharing operation of the address buffer 51.

The main amplifier 61 is activated based on the de-boosted voltage VPERI. Thus, the output of the main amplifier 61 is outputted from an external terminal Dout (or DQ) through an output buffer 62 activated based on the source voltage VDD supplied from the external terminal. A write signal inputted from an external terminal Din (or DQ) is captured through an input buffer 63. Further, the write signal is supplied to the main input/output lines MIO and MIOB through a write amplifier to be described later included in the main amplifier 61 in the drawing. A level shift circuit to be next described and a logic unit for synchronizing a level-shifted signal to be outputted with a timing signal and for outputting the synchronized signal therefrom are provided at the input of the output buffer.

Figure 5:
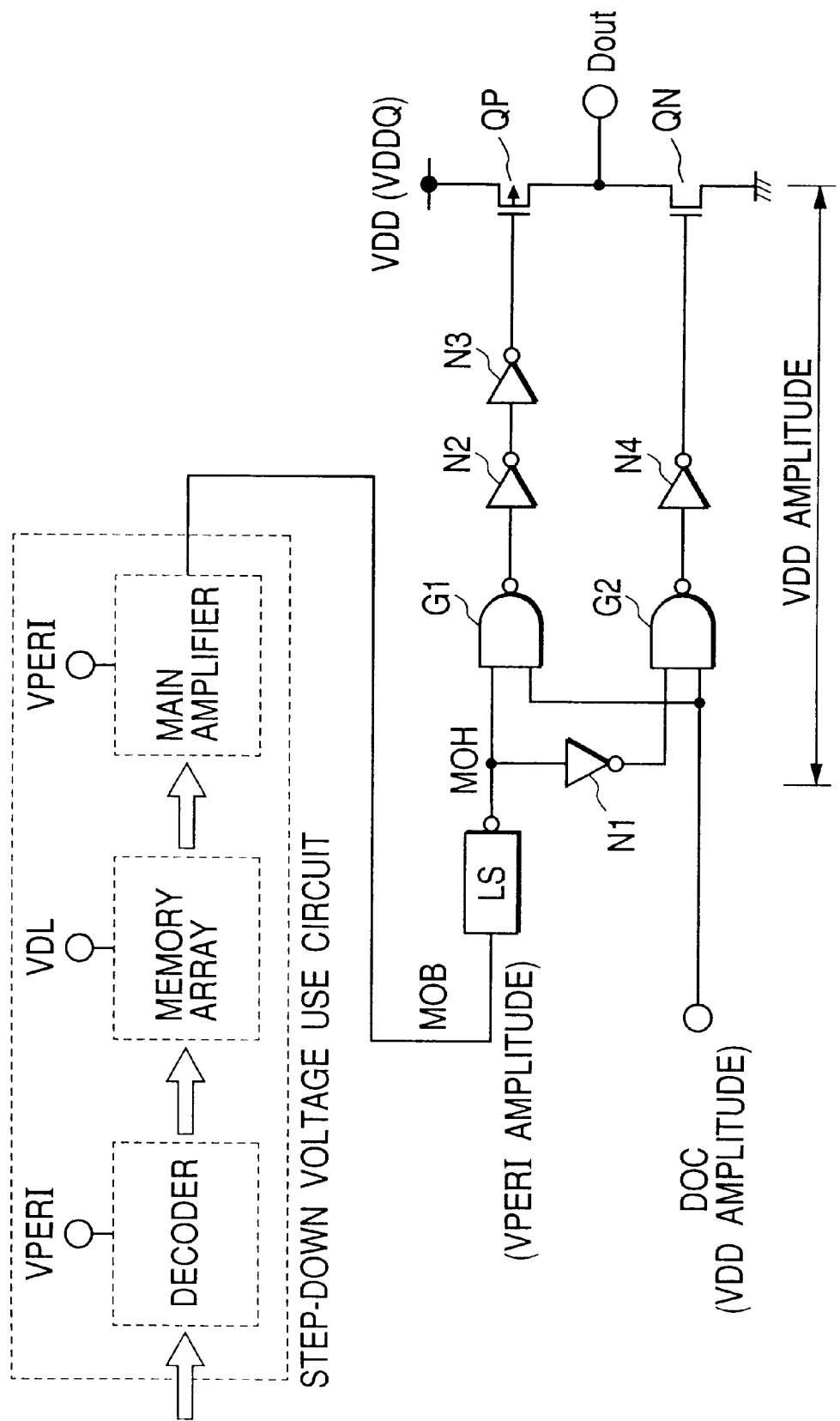
FIG. 5 is a schematic circuit diagram illustrating one embodiment of an output buffer employed in the dynamic RAM according to the present invention.

FIG. 5 is a circuit diagram showing one embodiment of the output buffer employed in the dynamic RAM according to the present invention. Circuit blocks for describing the entire operation of the dynamic RAM are shown together in the drawing. That is, a decoder is activated based on a de-boosted voltage VPERI so that a decode signal having signal amplitude corresponding to the reduced voltage VPERI is formed. A main word driver is activated based on a boosted voltage VPP. A memory array outputs a read signal having a signal amplitude corresponding to the operating voltage VDL of the sense amplifier as described above. Although the sense amplifier is transiently overdriven based on the voltage VDD or a voltage near the voltage as described above, it is finally activated based on the operating voltage VDL. A main amplifier is activated based on the de-boosted voltage VPERI so as to form or produce a read signal MOB corresponding thereto. In this regard, the term MOB means that the logic "1" is a low level and the logic "0" is a high level. An antiphase signal is represented as MO.

In the output buffer, the level shift circuit LS converts the level of the output signal MOB of the main amplifier, corresponding to the reduced voltage VPERI, to a voltage level corresponding to the external source voltage VDD (the level shift circuit LS amplifies the level of the output signal MOB). The amplified signal MOH is supplied to one input of a NAND gate G1. Further, the signal MOH is inverted by an inverter N1 and the resultant signal is supplied to one input of a NAND gate G2. The other inputs of these NAND gates G1 and G2 are supplied with a data output timing signal DOC having a signal level corresponding to the source voltage VDD. Since output MOSFETs QP and QN are formed in relatively large sizes to obtain a large load driving capability, they have a large gate capacity. Signals outputted from the gate circuits G1 and G2 are successively transmitted through inverters N2 through N4 to drive such output MOSFETs QP and QN at a high speed.

Figure 6:
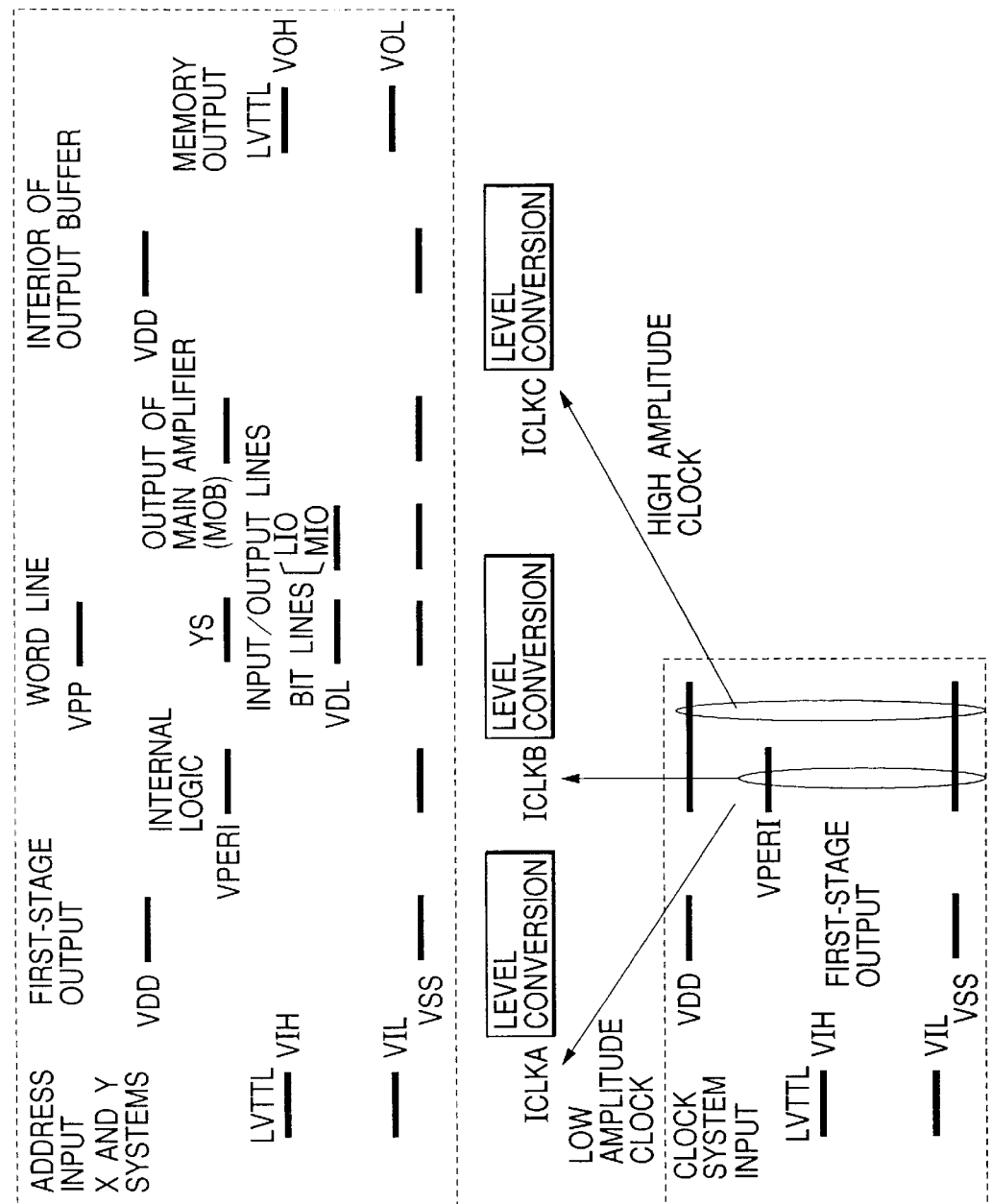
FIG. 6 is a potential distribution diagram depicting signal levels corresponding to operating voltages of respective circuits, which are associated with the sequence of operation of the dynamic RAM shown in FIG. 5.

FIG. 6 is a potential distribution diagram depicting signal levels corresponding to operating voltages of respective circuits employed in the dynamic RAM. That is, an address input is defined as a low amplitude signal such as VIH and VIL each corresponding to a low voltage TTL (LVTTL). The address buffer is activated based on the source voltage VDD and the circuit dround potential VSS, and the output of a first-stage circuit is level-shifted to levels such as VDD and VSS.

Since internal logic circuits such as an address latch, an address decoder circuit, etc. are activated based on the reduced voltage VPERI, the internal logic circuits produce signals like VPERI and VSS. A signal for selecting a word line (such as a main word line, a sub-word line) is brought to the boosted voltage like VPP and a non-selected level is brought to the ground potential like VSS. Since the sense amplifier is brought to the voltage VDL, which is set lower than the reduced voltage VPERI, the potential on the corresponding bit line is brought to high and low levels each corresponding thereto. The local input/output lines LIO and main input/output lines MIO are also respectively brought to a signal level corresponding to the de-boosted voltage VDL. The level for selecting the column select signal YS is brought to a high level corresponding to the reduced voltage VPERI. Further, the output signal of the main amplifier is also brought to an output signal corresponding to the de-boosted voltage VPERI. Thus, the main amplifier level-shifts the output signal from VDL to VPERI.

The level shift circuit LS level-shifts the high level corresponding to the reduced voltage VPERI to a high level corresponding to the source voltage VDD (amplifies the high level corresponding thereto so as to reach the high level corresponding to the source voltage VDD). Thus, a signal corresponding to the source voltage VDD is produced inside the output buffer. A clock system is classified into two types according to variations in the respective signal levels at such respective circuit blocks. A clock system input signal corresponding to the LVTTL is supplied and level-shifted by the first-stage circuit, where a high amplitude clock signal ICLKC corresponding to the source voltage VDD and clock signals ICLKA and ICLKB each corresponding to the de-boosted voltage VPERI are formed. The clock signals ICLKA and ICLKB are used for the address input and each internal circuit. The high amplitude clock signal ICLKC is used for the control of output timing of the output buffer.

Although the invention is not restricted in particular, the source voltage VDD supplied from the external terminal is set to 3.3 V, the de-boosted voltage VPERI supplied to the internal circuit is set to 2.5 V, and the operating voltage VDL of the sense amplifier is set to 2.0 V, respectively. Further, the word-line select signal (boosted voltage) is set to 3.8 V. A precharge voltage VBLR for each bit line is set to 1.0 V corresponding to VDL/2 and a plate voltage VPLT is also set to 1.0 V. Further, a substrate voltage VBB is set to −1.0 V.

Figure 7:
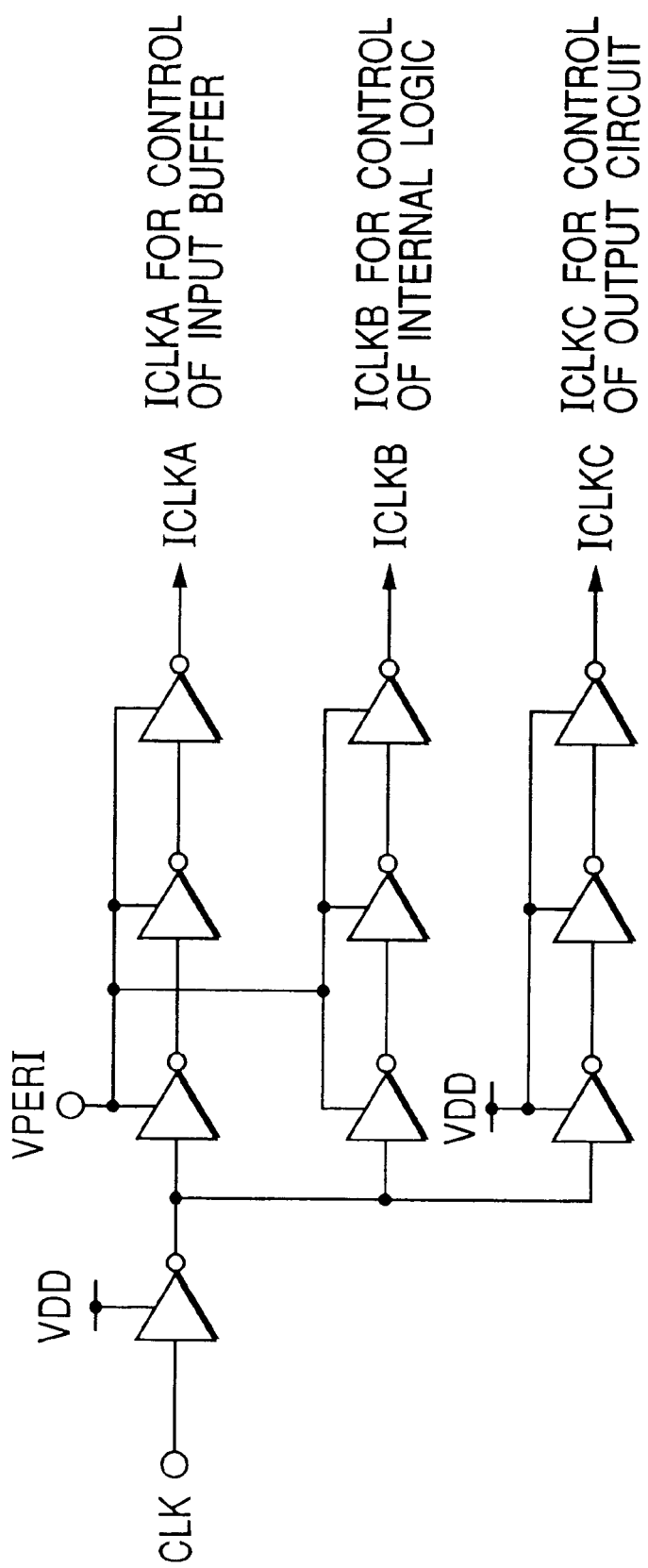
FIG. 7 is a schematic circuit diagram showing one embodiment of the clock-system circuit shown in FIG. 6.

FIG. 7 is a circuit diagram showing one embodiment of the clock system circuit. A clock signal CLK supplied from an external terminal passes through a first-stage circuit activated based on a source voltage VDD and thereafter logically processed by three types of circuits according to the above-described clock signals ICLKA through ICLKC.

With respect to the internal clock signals ICLKA and ICLKB, the clock signal ICLKA for the control of the input buffer and the clock signal ICLKB for the control of the internal logic are formed by allowing a VDD level signal formed by the first-stage circuit to pass through driver circuits such as inverter circuits or the like activated based on the reduced voltage VPERI. On the other hand, the internal clock signal ICLKC for the control of an output circuit is outputted as a high amplitude clock signal through driver circuits such as inverter circuits or the like activated based on the source voltage VDD. In practice, the respective internal clock signals ICLKA through ICLKC are not those outputted by allowing an inverter chain to convert the level of the external clock signal CLK into levels as it is. They are generated as signals subjected to logic processing corresponding to their corresponding operation modes and operating timing and thereby used as for the input buffer control, internal logic control and output circuit control.

As in the embodiment shown in FIG. 6, the decoder, memory array, main amplifier, etc. make use of the de-boosted voltages VPERI and VDL to ensure a voltage reduction and the reliability of each micro-fabricated device. The read signal MOB outputted from the main amplifier uses a signal amplitude corresponding to the reduced voltage VPERI, whereas a clock system signal DOC makes use of a high amplitude corresponding to the source voltage VDD. Thus, the read signal MOB is level-converted (shifted) by the level shift circuit LS and is subjected to logic processing with the timing signal DOC. The signal MOB is normally formed prior to the timing signal DOC. Therefore, even if the level shift circuit LS is inserted in the output buffer, a signal delay developed thereat can be controlled so as not to appear as a delay of Dout. Since the level shift circuit is unnecessary for a path as viewed from the clock system signal DOC, an access time tAC required to determine Dout can be made fast.

Figure 8:
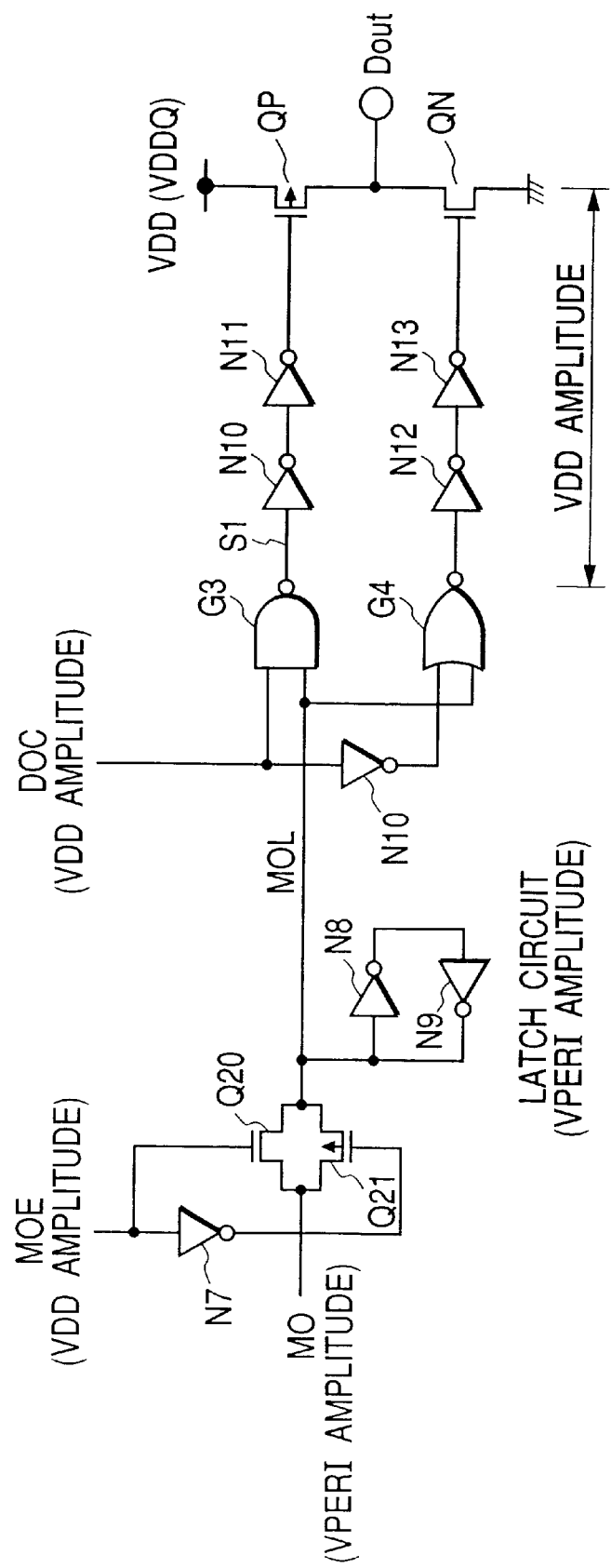
FIG. 8 is a schematic circuit diagram illustrating another embodiment of the output buffer employed in the dynamic RAM according to the present invention.

FIG. 8 is a circuit diagram showing another embodiment of the output buffer employed in the dynamic RAM according to the present invention. The present embodiment shows the example of the output buffer to which an output latch function is applied. A signal MOE is a latch signal. When the signal MOE is high in level, a signal MO outputted from a main amplifier is transmitted to a signal MOL. When the signal MOE is low in level, the signal MOL is held by a latch circuit comprised of two inverter circuits N8 and N9 whose inputs and outputs are cross-connected. Although the invention is not restricted in particular, the amplitude of the signal MOE is also set to VDD amplitude.

The present embodiment is suitable for use in circuits around the output of a synchronous DRAM. As already known, the synchronous DRAM needs a latch circuit used for controlling CAS latency. A clock access time tAC is determined by a path extending from a switch circuit controlled by the signal MOE to an output terminal Dout. In this case, a VDD amplitude signal is supplied from a clock system as a signal applied to each of the analog gates respectively comprised of an N channel type switch MOSFET Q20 and a P channel type switch MOSFET Q21. The VPERI amplitude signal from the series arrangement of the memory array and main amplifier is transmitted to their source and drain paths.

Since the amplitude of the signal applied to each of the source and drain paths of the switch MOSFETs Q20 and Q21 is given as the VPERI amplitude, a micro-fabricated device suitable for the low voltage can be used. On the other hand, since the thickness of the gate is set so as not to show the problem even if the word-line boosted voltage VPP and the source voltage VDD are applied thereto with one type of gate thickness tOX, the VDD amplitude signal can be directly applied to each gate. In doing so, the level shifting at the signal path through the use of the signal MOE becomes unnecessary. Thus, the clock access time can be shortened. Further, word-system and column-system access times are treated in a manner similar to the prior art. That is, a logic-in level shift circuit comprised of gate circuits G3 and G4 is used to simultaneously perform a gate operation and a level-shifting operation on the signal from the series arrangement of the memory array and main amplifier to thereby obtain the VDD amplitude. Thus, the simplification of the circuit can be also implemented together.

Figure 9A:
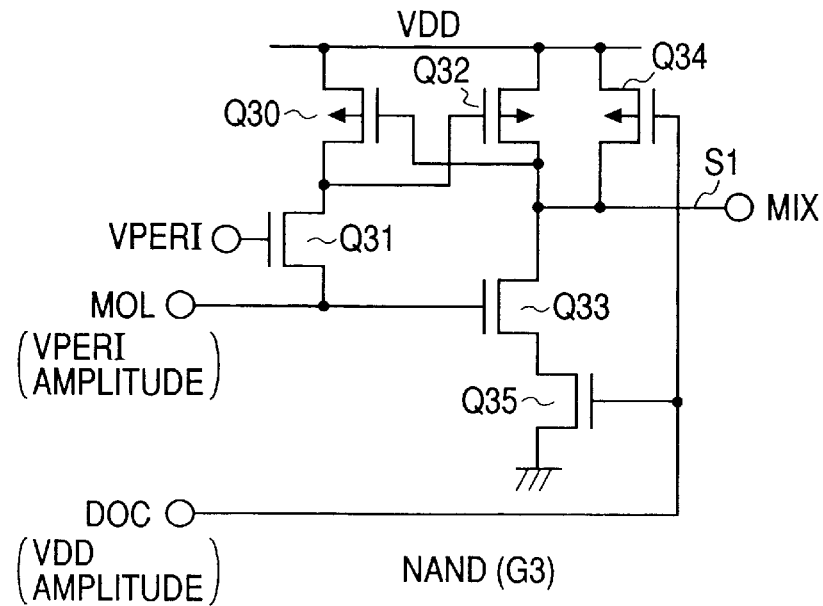
FIGS. 9A and 9B are respective schematic circuit diagrams depicting one embodiment of a logic-in level shift circuit according to the present invention.
Figure 9B:
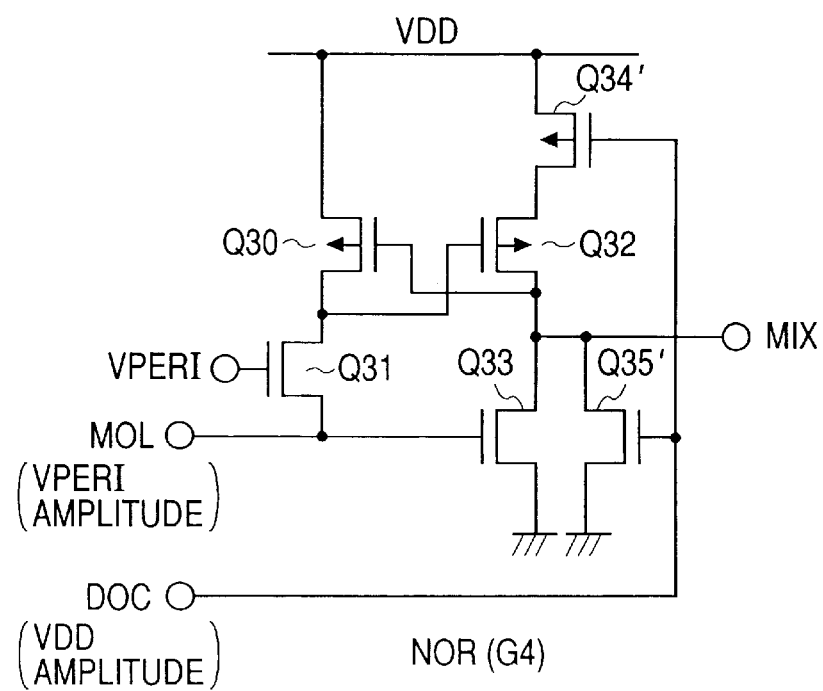

FIGS. 9A and 9B are respective circuit diagrams showing one embodiment of the logic-in level shift circuit according to the present invention. FIG. 9A shows a NAND gate circuit corresponding to the gate circuit G3 shown in FIG. 8. FIG. 9B illustrates a NOR gate circuit corresponding to the gate circuit G4 shown in FIG. 8.

Referring to FIG. 9A, a main amplifier output signal MOL having a low amplitude corresponding to a deboosted voltage VPERI is connected or supplied to the gate of an N channel MOSFET Q33 and the source of an N channel MOSFET Q31. The gate of the N channel MOSFET Q31 is supplied with the reduced voltage VPERI. P channel MOSFETs Q30 and Q32, whose gates and drains are electrically cross-connected to one another, are provided between the drains of the pair of MOSFETs Q31 and Q33 and a source voltage VDD.

To implement NOT-AND (NAND) logic, an N channel MOSFET Q35 is provided in a series combination with the N channel MOSFET Q33 whose drain is electrically connected to an output terminal MIX. A P channel MOSFET Q34 is provided in a parallel combination with the P channel MOSFET Q32 whose drain is electrically connected to the output terminal MIX. The gates of the N channel MOSFET Q35 and P channel MOSFET Q34 are respectively supplied with an output timing signal DOC corresponding to the source voltage VDD. Incidentally, the upper and lower connections of the MOSFETs Q33 and Q35 may be exchanged with one another.

The operation of the logic-in level shift circuit is as follows. When the output signal MOL of the main amplifier is of a high level (VPERI), the N channel MOSFET Q31 is turned off and the N channel MOSFET Q33 is turned on. Thus, when the timing signal DOC is low in level, the output terminal MIX is brought to a high level like the source voltage VDD by the P channel MOSFET Q34, which is turned on based on the low level of the timing signal DOC, regardless of the latching or latch operation of the P channel MOSFETs Q30 and Q32.

When the timing signal DOC changes from the low level to the high level, the P channel MOSFET Q34 is turned off and the N channel MOSFET Q35 is turned on. Thus, if the signal MOL is high in level, then the output terminal MIX changes from the high to low levels through the MOSFETs Q33 and Q35. If the signal MOL is low in level, then the N channel MOSFET Q31 is turned on and the N channel MOSFET Q33 is turned off. Therefore, the high level corresponding to the source voltage VDD is continuously outputted from the output terminal MIX by the P channel MOSFET Q32 whose gate is supplied with the low level of the signal MOL through the turned-on MOSFET Q31.

Referring to FIG. 9B, a main amplifier output signal MOL having a low amplitude corresponding to a deboosted voltage VPERI is connected or supplied to the gate of an N channel MOSFET Q33 and the source of an N channel MOSFET Q31 in a manner similar to the above. The gate of the MOSFET Q31 is supplied with the reduced voltage VPERI. P channel MOSFETs Q30 and Q32, whose gates and drains are electrically cross-connected to one another, are provided between the drains of the pair of MOSFETs Q31 and Q33 and a source voltage VDD.

To implement NOT-OR (NOR) logic, an N channel MOSFET Q35' is provided in a parallel combination with the N channel MOSFET Q33 whose drain is electrically connected to an output terminal MIX. A P channel MOSFET Q34' is provided in a series combination with the P channel MOSFET Q32 whose drain is electrically connected to the output terminal MIX. The gates of the N channel MOSFET Q35' and P channel MOSFET Q34' are respectively supplied with an output timing signal DOC corresponding to the source voltage VDD. Incidentally, the upper and lower connections of the MOSFETs Q32 and Q34' may be reversed.

The operation of the logic-in level shift circuit is as follows. When the output signal MOL of the main amplifier is of a low level (0 V), the N channel MOSFET Q31 is turned on and the-N channel MOSFET Q33 is turned off. Thus, when the timing signal DOC is high in level, the output terminal MIX is brought to a low level like a circuit ground potential VSS by the N channel MOSFET Q35', which is turned on based on the high level of the timing signal DOC, regardless of the latching of the P channel MOSFETs Q30 and Q32.

When the timing signal DOC changes from the high level to low levels, the P channel MOSFET Q34' is turned on and the N channel MOSFET Q35' is turned off. Thus, if the signal MOL is low in level, then the N channel MOSFET Q31 is turned on so that the low level of the signal MOL is supplied to the gate of the P channel MOSFET Q32 which in turn is turned on. Thus, the output terminal MIX changes from the low to high levels by the turned-on MOSFETs Q32 and Q34'. If the signal MOL is high in level, then the N channel MOSFET Q31 is turned off and the N channel MOSFET Q33 is turned on. Therefore, the low level like the ground potential VSS is continuously outputted from the output terminal MIX.

When such a logic-in level shift circuit is used in FIG. 8, it can be configured by a circuit identical in logic function to the level shift circuit. It is therefore possible to simplify the circuit. Further, since the number of logic stages inserted into the signal transmission path can be reduced as described above, the circuit can be also activated at high speed. If the level shift circuit with the NAND function shown in FIG. 9A is used for the gate circuits G1 and G2 shown in FIG. 5, then the LS circuit corresponding to the simple level shift circuit can be omitted. It is therefore possible to activate the output circuit shown in FIG. 5 at high speed and reduce the area for the output circuit.

That is, even when the logic of two signals different in level from each other in general is taken to thereby obtain a level-shifted output signal in addition to the output of the signal in synchronism with the timing signal DOC as described above, the first input signal having the low amplitude described above and the second input signal having the high amplitude described above are utilized in combination as described above, whereby the logic output of the OR and AND operations can be carried out in combination with the level shifting.

Figure 10:
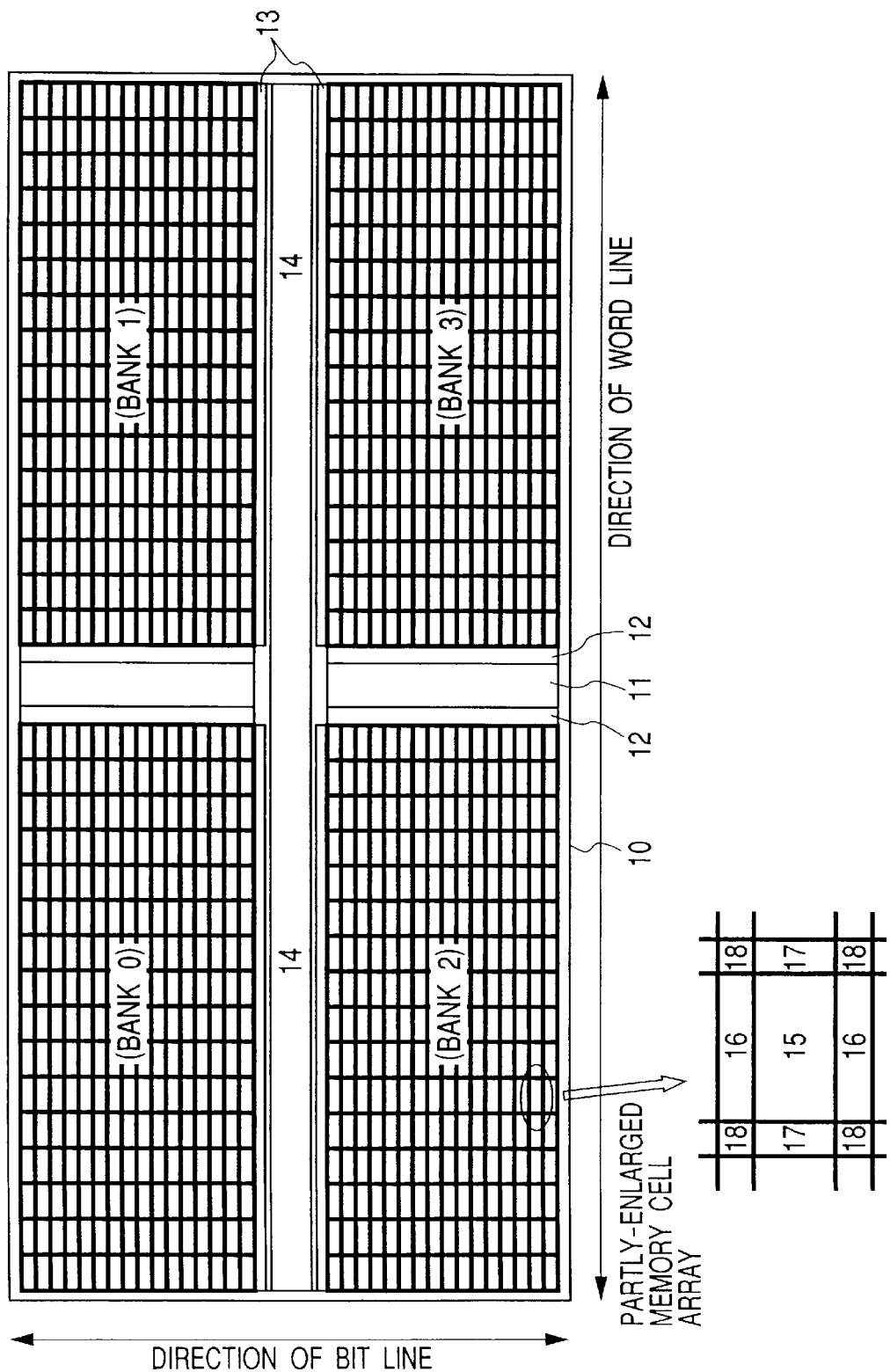
FIG. 10 is a schematic layout diagram showing one embodiment of a synchronous dynamic RAM to which the present invention is applied.

FIG. 10 is a schematic layout diagram showing one embodiment of a synchronous DRAM (dynamic RAM) to which the present invention is applied. Memory arrays and sub-arrays are basically identical in configuration to those employed in the first embodiment. However, main row decoders 11 and main word drivers 12 are collectively provided in a longitudinal central portion of a chip to achieve a further reduction in area. Further, the entire chip is divided into four parts by the main row and word drivers 11 and 12 and the above-described peripheral circuit area 14. Banks 0 through 3 are respectively assigned to the four parts. Main operation modes of the synchronous DRAM instructed by commands are as follow:

(1) Mode register set command (Mo):

This is a command for setting a mode register included in the input circuit. The corresponding command is specified by CSB, RASB, CASB and WEB=low level. Data (register set data) to be set is supplied through each of A0 through Ai. Now, CSB is given as a chip select signal, RASB is given as a row address strobe signal, CASB is given as a column address strobe signal, and WEB is given as a write enable signal. The letter B designated at the ends of the respective signal names respectively indicate that the low level is taken as an active level.

Although the invention is not restricted in particular, the register set data includes a burst length, a CAS latency, a write mode, etc. Although the invention is not restricted in particular, a settable burst length includes 1, 2, 4, 8 and a full page. A settable CAS latency assumes 1, 2 and 3. A settable write mode is defined as a burst write and a single write.

The CAS latency indicates what cycles of internal clock signal are wasted from the falling edge of the signal CASB to the output operation of an output buffer upon a read operation specified by a column address/read command to be described later. Since an internal operation time used for the reading of data is required until the read data is established or determined, the CAS latency is used to set the internal operation time according to the frequency of the internal clock signal. When an internal clock signal of a high frequency is used, for example, the CAS latency is set to a relatively large value. On the other hand, when an internal clock signal of a low frequency is used, the CAS latency is set to a relatively small value.

(2) Row address strobe/bank active command (Ac):

This is a command for providing instructions for a row address strobe and for making the selection of four memory banks based on A12 and A13 effective. This command is specified according to CSB and RASB=low level and CASB and WEB=high level. At this time, address signals A11 through A0 except for the two leftmost bits are taken in or captured as row address signals, whereas address signals A12 and A13 corresponding to the two leftmost bits are captured as signals for selecting memory banks. Their capture operations are executed in synchronism with the leading edge of the internal clock signal as described above. When the corresponding command is specified, for example, a word line in a memory bank specified by the command is selected. Thus, memory cells connected to the corresponding word line and their corresponding complementary bit lines are brought into conduction.

(3) Column address/read command (Re):

This is a command required to start a burst read operation. Further, this is also a command for providing instructions for a column address strobe. The present command is specified according to CSB and CASB=low level and RASB and WEB=high level. Addresses supplied at this time are captured as column address signals respectively. Thus, the captured column address signals are supplied to a column address counter as burst start addresses. Before the burst read operation specified thereby, a memory bank and a word line lying therein have been selected in the row address strobe/bank active command cycle. Upon the burst read operation in this state, memory cells connected to the selected word line are successively selected in accordance with each address signal outputted from the column address counter in synchronism with the internal clock signal and items of data are sequentially read therefrom. The number of the sequentially-read data is set as a number specified by the above burst length. The output buffer starts reading data while waiting for the number of cycles in the internal clock signal defined by the CAS latency.

(4) Column address/write command (Wr):

When the burst write is set to the mode register as a write operation mode, this command is defined as a command required to start the corresponding burst write operation. When the single write is set to the mode register as a write operation mode, this command is defined as a command required to start the corresponding single write operation. Further, the corresponding command provides instructions for column address strobes at the single write and the burst write. The corresponding command is specified according to CSB, CASB and WEB=low level and RASB=high level. Addresses at this time are captured as column address signals. Thus, the captured column address signals are supplied to the column address counter as burst start addresses upon the burst write. The procedure of the burst write operation specified thereby is also performed in a manner similar to the burst read operation. However, no CAS latency is provided for the write operation and the capturing of the write data is started from the column address/write command cycle.

(5) Precharge command (Pr):

This is defined as a command for starting a precharge operation on each memory bank selected by address signals corresponding to the two leftmost bits. This command is specified by CSB, RASB and WEB=low level and CASB=high level.

(6) Autorefresh command:

This is a command required to start autorefresh and specified by CSB, RASB and CASB=low level and WEB and CKE (Clock Enable)=high level.

(7) Burst stop/in/full page command:

This is a command required to stop all the memory banks from a burst operation for a full page. This command is ignored in burst operations other than that for the full page. This command is specified by CSB and WEB=low level and RASB and CASB=high level.

(8) No-operation command (Nop):

This is a command for indicating the non-execution of a substantial operation and is specified by CSB=low level and RASB, CASB and WEB=high level.

Figure 11:
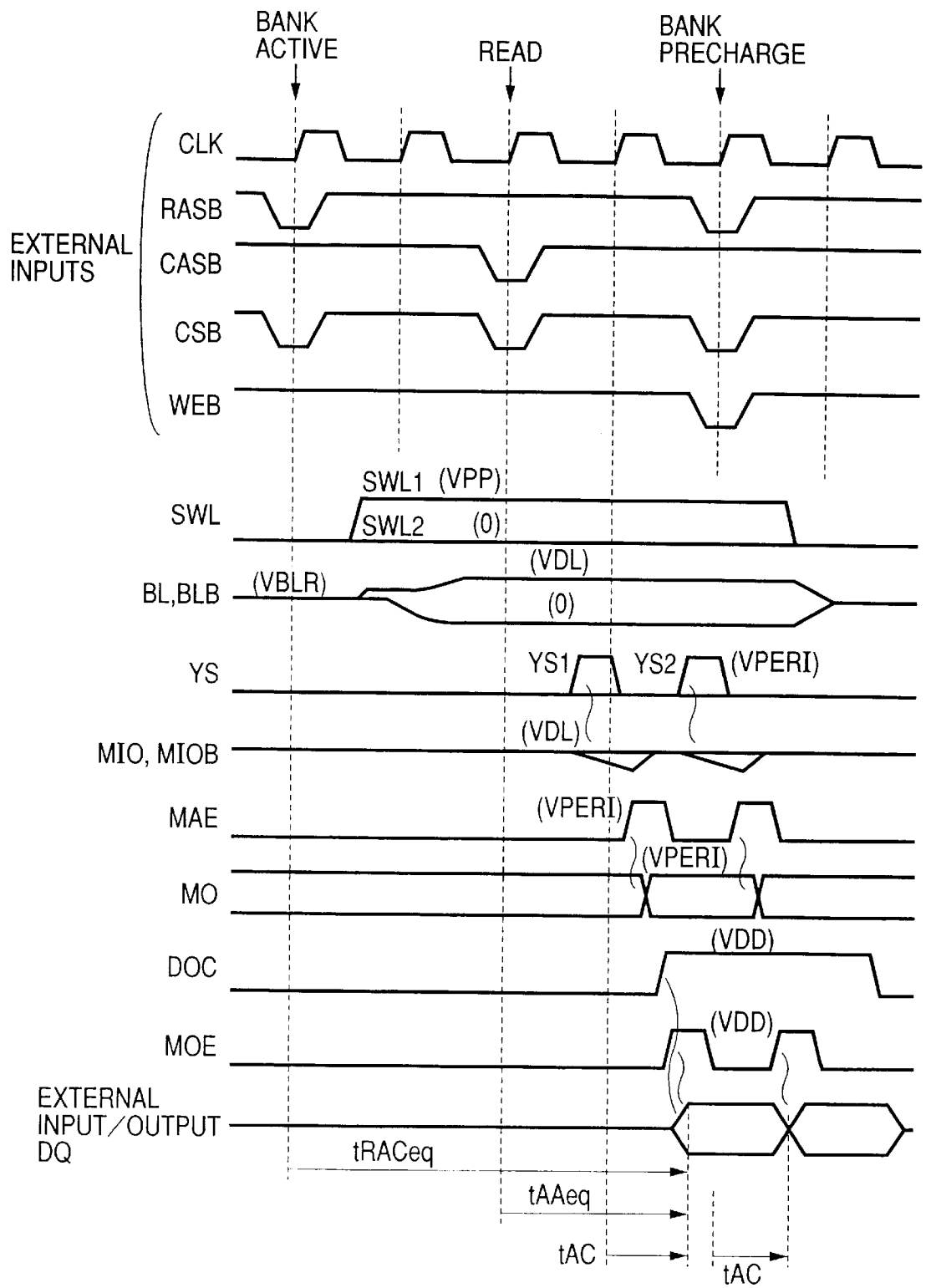
FIG. 11 is a waveform diagram for illustrating one example of the operation of the synchronous dynamic RAM shown in FIG. 10.

FIG. 11 is a waveform diagram for describing the operation of the synchronous DRAM to which the present invention is applied. The drawing shows the burst length BL=2 and the CAS latency CL=2 by way of illustrative example.

The values BL=2 and CL=2 are set to the above-described mode register. As described above, BL=2 indicates that reading/writing is performed through two column switches in two continuous cycles, and CL=2 indicates that data is outputted from an output terminal DQ after two cycles from the read command.

A row-system address signal is captured from an unillustrated address input terminal according to the bank active command and is decoded so that the corresponding sub-word line SWL is brought to a select level like VPP. Thus, a micro read signal appears on the complementary bit lines BL and BLB. Since the sense amplifier is activated by an operation timing signal, the micro read signal on the complementary bit lines BL and BLB is amplified to a high level like VDL and a low level like VSS so that the re-writing (refresh) of data into the corresponding memory cell at which the sub-word line SWL is selected, is performed.

A read command is inputted after two cycles from the bank active command and thereby an unillustrated column-system address signal is captured to raise a column select signal YS1. Thus, main input/output lines MIO and MIOB are precharged to a VDL level till the operation immediately before the column selection, whereby a voltage difference which ranges from 100 mV to 150 mV, is obtained from the YS-selected bit-line information. This is amplified by a main amplifier activated by a signal MAE to form or produce an output signal MO. Since the signal MO outputted from the main amplifier is given as the low amplitude signal corresponding to the de-boosted voltage VPERI as described above, it is level-shifted by an input portion of an output buffer. As in the embodiment shown in FIG. 5 or 8, the signal is converted to the VDD level and outputted in synchronism with the output timing signal DOC. When BL=2, a Y-system address is selected in synchronism with a clock CLK subsequent to the read command and correspondingly, the output signal MO of the main amplifier is formed.

An access time required until the initial output signal DQ is determined starting from the bank active command is given as tRACeq, an access time required until the output signal DQ is determined starting from the read command, is given as tAAeq, and an access time required until the output signal DQ is determined starting from the clock signal CLK, is given as tAC. Since the high amplitude signal having the VDD level is used for a latency control signal MOE and an output control signal DOC in accordance with the present invention, the time spent in the level shifting can be omitted. As a result, the access time tAC can be shortened. Further, an electric current, which flows into each MOSFET driven by the above high amplitude signal, can bQ increased under the control of the high amplitude signal and a signal delay produced therein can be also reduced, thus resulting in a contribution toward higher speed. Thus, the cycle of the clock signal CLK can be shortened correspondingly and the synchronous DRAM can be speeded up.

Operations and effects obtained from the aforementioned embodiments are as follows:

(1) An advantageous effect can be obtained in that, in a semiconductor integrated circuit device provided with an internal circuit which receives a source voltage supplied from an external terminal and which is activated based on a voltage obtained by reducing the source voltage, and an output circuit for outputting a signal to be outputted produced from or by the internal circuit, through an external terminal in accordance with a timing signal, the signal to be outputted produced by the internal circuit is converted to a signal level corresponding to the source voltage while low power consumption and high reliability are achieved by using the reduced voltage, and the converted signal level is outputted from the output circuit using a timing signal of a voltage level corresponding to the source voltage supplied from the external terminal, so that the above-described level shifting operation can be prevented from being seen as viewed from the timing signal, whereby the operation of the device can be speeded up.

(2) An advantageous effect can be obtained in that, of the above-described input circuit, an input portion for receiving the clock signal supplied from the external terminal therein and a clock distribution circuit for generating a clock signal supplied to the output circuit are activated using the source voltage supplied from the external terminal as an operating voltage, whereby an output signal corresponding to the clock signal can be outputted at high speed because no level shifting exists in a path in which an internal clock signal is generated.

(3) An advantageous effect can be obtained in that since the input circuit is activated based on the source voltage supplied from the external terminal, an input/output interface can be set so as to correspond to the source voltage.

(4) An advantageous effect can be obtained in that each of a logic unit included in the output circuit and for transmitting the signal to be outputted in accordance with the timing signal and the level shift circuit is constructed by using a logic-in level shift circuit comprised of first and second N channel MOSFETs for complementarily performing a switching operation according to the signal produced by the internal circuit to be outputted, first and second P channel MOSFETs provided between the drains of the first and second N channel MOSFETs and the source voltage supplied from the external terminal and whose gates and drains are electrically cross-connected to one another, a third N channel MOSFET which receives the timing signal at the gate thereof and is electrically series (or parallel)-connected to one of the pair of N channel MOSFETS, whose drain is electrically connected to an output terminal, and a third P channel MOSFET electrically parallel (or series)-connected to one of the cross-connected P channel MOSFETS, whose drain is electrically connected to the output terminal, whereby circuit simplification can be also achieved.

(5) An advantageous effect can be obtained in that since the logic-in level shift circuit is constructed as one in which the signal to be outputted produced by the internal circuit is supplied to the gate of the first N channel MOSFET, the internal de-boosted voltage is supplied to the gate of the second N channel MOSFET, the signal to be outputted formed by the internal circuit is supplied to the source thereof, and the drain of the first N channel MOSFET is electrically connected to the output terminal, the circuit can be simplified and the signal to be outputted can be produced by a single-ended amplifier circuit, thus making it possible to reduce signal wires or interconnections.

(6) An advantageous effect can be obtained in that in a dynamic RAM including dynamic memory cells each comprised of an address selection MOSFET whose gate is electrically connected to each of the word lines, whose one source or drain is electrically connected to its corresponding bit line intersecting the word line, and whose other source or drain is electrically connected to a storage node of a storage capacitor, memory arrays each including amplification MOSFETs for each sense amplifier for amplifying a small voltage based on information charges of the storage capacitor, which is read out on the bit line side, precharge MOSFETs each of which supplies a precharge voltage to the bit line, and column switch MOSFETs each of which selects a bit line, decoders each of which produces a select signal for the word and bit lines, and main amplifiers each of which reads information stored in a memory cell selected through the column switch, the decoder and main amplifier are supplied with a first operating voltage produced from the de-boosting or step-down circuit and each amplification MOSFET for the sense amplifier is supplied with a second operating voltage produced by the de-boosting circuit and set lower than the first operating voltage, whereby low power consumption and high reliability are achieved and the dynamic RAM can be activated at high speed owing to the provision of the above-described output buffer.

(7) An advantageous effect can be obtained in that the word lines comprise a main word line and a plurality of sub-word lines assigned commonly to the main word line, the gates of the address selection MOSFETs for the dynamic memory cells are respectively electrically connected to the sub-word lines, one of the plurality of the sub-word lines is selected by each of sub-word drivers, which receives a signal for the main word line and a signal for each sub-word select line therein, and the sub-word drivers are also included in each memory array, whereby a highly-integrated and highly-capacity dynamic RAM can be obtained.

(8) An advantageous effect can be obtained in that low power consumption and high reliability are achieved by using an internal circuit supplied with a source voltage supplied from an external terminal and activated based on its reduced voltage, and a logic unit for logically processing a first signal produced by the internal circuit and a second signal corresponding to the source voltage supplied from the external terminal is comprised of first and second N channel MOSFETs for complementarily performing a switching operation according to the first signal, first and second P channel MOSFETs provided between the drains of the first and second N channel MOSFETs and the source voltage supplied from the external terminal and whose gates and drains are electrically crossconnected to one another, a third N channel MOSFET which receives the second signal at the gate thereof and is electrically series (or parallel)-connected to one of the pair of N channel MOSFETS, whose drain is electrically connected to an output terminal, and a third P channel MOSFET which receives the second signal at the gate thereof and is electrically parallel (or series)-connected to one of the cross-connected P channel MOSFETS, whose drain is electrically connected to the output terminal, whereby a logic function and a level shifting operation can be performed with a simple circuit.

(9) An advantageous effect can be obtained in that the first signal is supplied to the gate of the first N channel MOSFET, the reduced voltage is supplied to the gate of the second N channel MOSFET, the first signal is supplied to the source thereof, and the drain of the first N channel MOSFET is electrically connected to the output terminal, whereby the circuit can be simplified and the signal to be outputted can be produced by a single-ended amplifier circuit, thus making it possible to reduce signal wires or interconnections.

The invention, which has been made by the present inventors, has been described above specifically by reference to various embodiments. However, the present invention is not necessarily limited to the embodiments. It is needless to say that various changes can be made to the invention within a scope not departing from the substance thereof. For example, the configurations of memory arrays, sub-arrays and sub-word drivers employed in the dynamic RAM shown in FIG. 1 or 10 can take various forms. A word-shunt system excluding the sub-word drivers may be adopted. The logic-in level shift circuit may be constructed so that the gates of the N channel MOSFETs Q31 and Q33 are supplied with the complementary input signals MO and MOB in FIGS. 9A and 9B. Further, the clock-system signal may not be a source voltage VDD level itself. That is, a slight reduction to the extent that it is still free of the need for level shifting at the subsequent stage may be performed. For example, such a slight reduction can be simply implemented if the voltage on the source side of an N channel MOSFET in which a boosted voltage VPP is applied to the gate thereof and a source voltage VDD is applied to the drain thereof, is used. As a dynamic RAM for outputting data corresponding to a clock signal, any dynamic RAM may be adopted which can perform similar operations, as well as the above-described dynamic RAM. That is, the present invention is widely available for a semiconductor integrated circuit device provided with one for performing an output operation according to a timing signal or provided with an internal circuit activated by an internal de-boosting or step-down circuit and an output circuit for converting a signal resulting from the internal circuit to a level corresponding to the external source voltage and outputting it therefrom.

Advantageous effects obtained by a typical one of the features disclosed in the present application will be briefly described as follows: In a semiconductor integrated circuit device provided with an internal circuit which receives a source voltage supplied from an external terminal and is activated based on a voltage obtained by reducing or de-boosting the source voltage, and an output circuit for outputting a signal to be outputted produced from the internal circuit, through an external terminal in accordance with a timing signal, the signal to be outputted produced by the internal circuit is converted to a signal level corresponding to the source voltage while low power consumption and high reliability of the device are being achieved by using the de-boosted voltage. In this state, the converted signal level is outputted from the output circuit using a timing signal of a voltage level corresponding to the source voltage supplied from the external terminal. As a result, the above-described level shifting operation can be prevented from being seen, whereby the operation of the device can be speeded up.

Low power consumption and high reliability are achieved by using an internal circuit supplied with a source voltage supplied from an external terminal and activated based on its reduced voltage. Further, a logic unit for logically processing a first signal produced by the internal circuit and a second signal corresponding to the source voltage supplied from the external terminal is comprised of first and second N channel MOSFETs for complementarily performing a switching operation according to the first signal, first and second P channel MOSFETs provided between the drains of the first and second N channel MOSFETs and the source voltage supplied from the external terminal and whose gates and drains are electrically cross-connected to one another, a third N channel MOSFET which receives the second signal at the gate thereof and is electrically series (or parallel)-connected to one of the pair of N channel MOSFETS, whose drain is electrically connected to an output terminal, and a third P channel MOSFET which receives the second signal at the gate thereof and is electrically parallel (or series)-connected to one of the cross-connected P channel MOSFETS, whose drain is electrically connected to the output terminal, whereby a logic function and a level shifting operation can be performed with a simple circuit.

The embodiment shown in FIG. 5 and the embodiment shown in FIG. 8 are effective for speeding-up operations at the time that small-amplitude signals (MOB and MOL) each corresponding to an internal low potential (VPERI) are respectively converted to large-amplitude signals (MOH and S1) each corresponding to an external voltage (VDD), thereby outputting a signal (Dout) to the outside. Points common to these embodiments are as follows. That is, the signals corresponding to the low potential (VPERI) can be respectively converted to signals corresponding to the external voltage (VDD) before a timing signal (DOC) used to output data to the outside is made active. Thus, since the time required to perform signal level-shifting is not included within a period from the time when the timing signal (DOC) used to output the data to the outside is made active to the time when the signal (Dout) is actually outputted to the outside, a high-speed output can be achieved. Particularly, the present invention is effective for a case in which after a low-amplitude output signal produced from a main amplifier has reached an output circuit or the neighborhood thereof, it is outputted to the outside at high speed in response to an internal timing signal. Since there may be often cases where the main amplifier and the output circuit are electrically connected to one another through relatively long wires or interconnections, the transmission of the output signal produced from the main amplifier to the output circuit or its neighborhood while the output signal remains subjected to low amplitude, is effective for low voltage consumption.

Figure 12A:
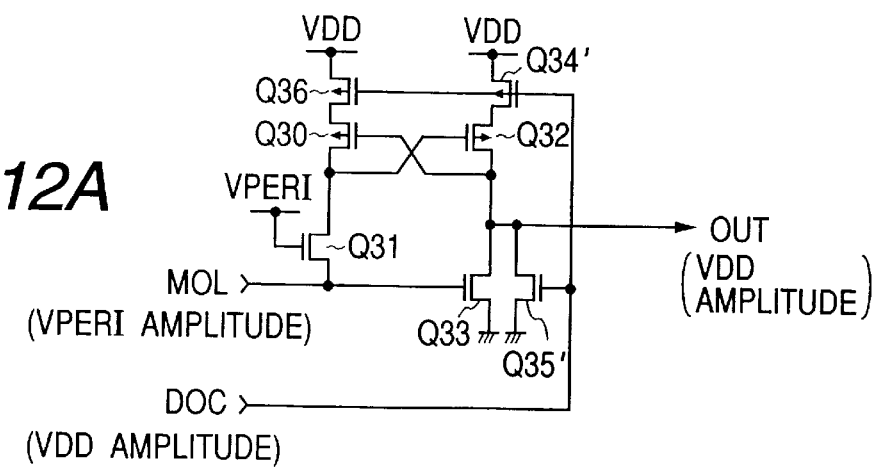
FIGS. 12A. 12B and 12C are respective schematic circuit diagrams illustrating other embodiments of a logic-in level shift circuit according to the present invention.

FIG. 12A shows a modification of the circuit shown in FIG. 9B. A transistor Q36 is added thereto. The transistor Q36 is provided to cut an undesired current produced when a signal MOL is low in level and a timing signal DOC is changed to a high level. That is, the transistor Q36 is provided to prevent an undesired current from flowing from the source VDD side to the signal MOL side through transistors Q30 and Q31.

Figure 12B:
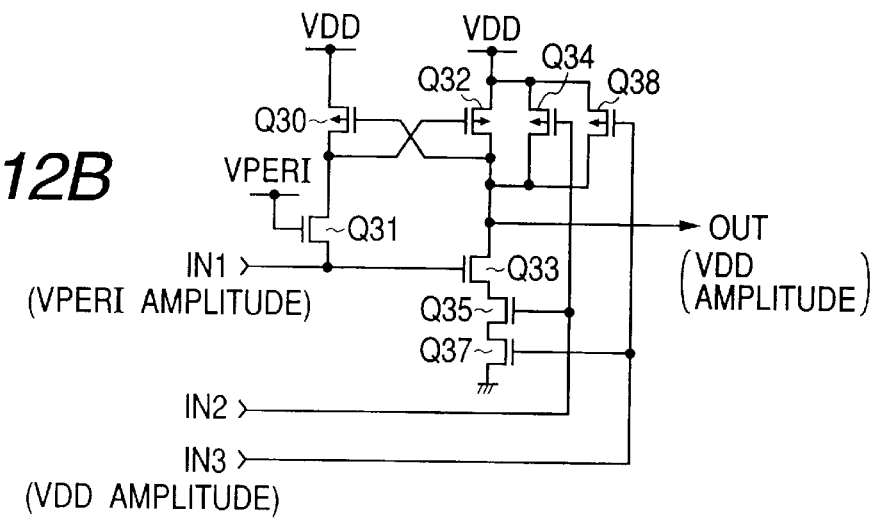

FIG. 12B illustrates a modification of the two-input NAND circuit shown in FIG. 9A. This constitutes a three-input (INI, IN2 and IN3) NAND circuit. That is, transistors Q37 and Q38 for receiving a timing signal IN3 are additionally provided.

Figure 12C:
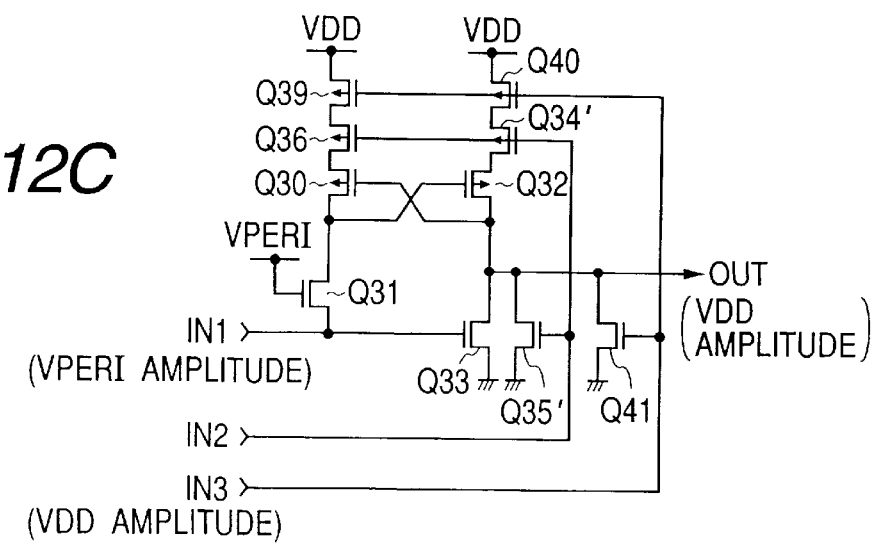

FIG. 12C depicts a modification of the two-input NOR circuit shown in FIG. 12A. This constitutes a three-input (IN1, IN2 and IN3) NOR circuit. That is, transistors Q39 and Q40 for receiving a timing signal IN3 are additionally provided.

What is claimed is:

1. A semiconductor integrated circuit device, comprising:
    a voltage reduction circuit which reduces a source voltage supplied from an external terminal;
    an input circuit which receives an input signal supplied from an external terminal;
    an internal reduced circuit activated based on an internal voltage produced by said voltage reduction circuit;
    an output circuit which outputs a signal in accordance with a timing signal through an external terminal; and
    a level shift circuit which converts a signal to be outputted produced from said internal circuit to a signal level corresponding to the source voltage level supplied from the external terminal,
    wherein said timing signal has a signal level corresponding to the source voltage level supplied from the external terminal, and said output circuit outputs the signal converted by said level shift circuit therefrom.

2. The semiconductor integrated circuit device according to claim 1, further comprising a timing signal generator circuit for generating said timing signal, based on a clock signal supplied from an external terminal, and wherein said timing signal generator circuit uses the source voltage supplied from the external terminal as an operating voltage.

3. The semiconductor integrated circuit device according to claim 1 or 2, wherein said input circuit is activated based on the source voltage supplied from the external terminal.

4. The semiconductor integrated circuit device according to claim 1 or 2, wherein said level shift circuit comprises a logic-in level shift circuit, said logic-in level shift circuit comprising,
    a pair of first and second N channel MOSFETs which complementarily perform a switch operation according to the signal to be outputted produced from said internal circuit, and first and second P channel MOSFETs provided between the drains of the first and second N channel MOSFETs and the source voltage supplied from the external terminal and whose gates and drains are electrically cross-connected to one another; and
    a third N channel MOSFET which receives said timing signal at the gate thereof and is electrically series-connected to one of the pair of N channel MOSFETS, the drain of said one N channel MOSFET being electrically connected to an output terminal, and a third P channel MOSFET electrically parallel-connected to one of the cross-connected P channel MOSFETS, the drain of said one P channel MOSFET being electrically connected to the output terminal.

5. The semiconductor integrated circuit device according to claim 1 or 2, wherein said level shift circuit comprises a logic-in level shift circuit, said logic-in level shift circuit comprising,
    a first N channel MOSFET which receives a signal to be outputted produced by said internal circuit at the gate thereof;
    a second N channel MOSFET which receives said internal reduced voltage at the gate thereof and receives said signal to be outputted produced by said internal circuit at the source thereof;
    first and second P channel MOSFETs provided between the drains of said first and second N channel MOSFETs and a source voltage supplied from an external terminal and whose gates and drains are electrically cross-connected to one another; and
    a third N channel MOSFET which receives the timing signal at the gate thereof and is electrically series-connected to said first N channel MOSFET, and a third P channel MOSFET electrically parallel-connected to one of said cross-connected P channel MOSFETs, the drain of said one P Channel MOSFET being electrically connected to an output terminal.

6. The semiconductor integrated circuit device according to claim 1 or 2, wherein said internal circuit comprises,
    a memory array including,
        dynamic memory cells each comprised of an address selection MOSFET having a gate connected to one of a plurality of word lines and whose one source or drain is connected to one of a plurality of bit lines, intersecting said one word line and whose other source or drain is connected to a storage node of a storage capacitor;
        amplification MOSFETs for sense amplifiers each of which amplifies a small voltage in accordance with an information charge, read out into said bit line, which charge is stored in said storage capacitor,
        precharge MOSFETs each of which supplies a precharge voltage to said bit line; and
        column switch MOSFETs each of which selects said bit line;
    a predecoder and a decoder which respectively produce signals for selecting said word line and bit line; and a main amplifier which reads information stored in said memory cell selected through said column switch, wherein said predecoder and decoder and said main amplifier are supplied with a first operating voltage produced by said voltage reduction circuit, and said amplification MOSFETs for said each sense amplifier are supplied with a second operating voltage produced by said de-boosting circuit and set lower than the first operating voltage.

7. The semiconductor integrated circuit device according to claim 6, wherein said word lines comprise a main word line and a plurality of sub-word lines assigned commonly to the main word line, the gate of the address selection MOSFET of each dynamic memory cell is connected to a sub-word line, and one of said plurality of sub-word lines is selected by a sub-word driver which receives a signal for said main word line and a signal for a sub-word select line therein.

8. A semiconductor integrated circuit device, comprising:

a voltage reduction circuit which reduces a source voltage supplied from an external terminal;

an input circuit which receives an input signal supplied from an external terminal, an internal circuit activated based on an internal reduced voltage produced by said voltage reduction circuit; and an output circuit which is activated based on the source voltage supplied from said external terminal and outputs a signal to be outputted produced by said internal circuit through an external terminal, said output circuit including, a logic unit which performs logic processing on a first signal produced by said internal circuit and a second signal corresponding to the source voltage supplied from the external terminal, said logic unit comprising, a pair of first and second N channel MOSFETs each of which complementarily performs a switching operation according to the first signal, and first and second P channel MOSFETs provided between the drains of said first and second N channel MOSFETs and the source voltage supplied from the external terminal and whose gates and drains are electrically cross-connected to one another; and a third N channel MOSFET which receives the second signal at the gate thereof and is electrically series-connected to one of said pair of N channel MOSFETS, the drain of said one being electrically connected to an output terminal, and a third P channel MOSFET which receives the second signal at the gate thereof and is electrically parallel-connected to one of said cross-connected P channel MOSFETS, the drain of said one P channel MOSFET being electrically connected to an output terminal.

9. The semiconductor integrated circuit device according to claim 8, wherein the first signal is supplied to the gate of said first N channel MOSFET, the de-boosted voltage is supplied to the gate of said second N channel MOSFET, the first signal is supplied to the source thereof, and the drain of said first N channel MOSFET is electrically connected to said output terminal.

10. A semiconductor integrated circuit device, comprising:

a voltage reduction circuit which reduces a first voltage supplied from a first terminal;

an input circuit which receives an input signal supplied from a second terminal;

an internal circuit activated based on a second voltage produced by said voltage reduction circuit; and an output circuit which outputs a signal to be outputted produced by said internal circuit, in accordance with a timing signal through a third terminal, and wherein a level shift circuit converts the signal to be outputted produced from said internal circuit to a signal level corresponding to the first voltage level and supplies it to said output circuit, and said output circuit outputs the signal transmitted through said level shift circuit in response to a timing signal of a voltage level corresponding to the first voltage.

11. The semiconductor integrated circuit device according to claim 10, wherein said timing signal is produced in accordance with a clock signal supplied from a fourth terminal, and an input portion of said input circuit, for receiving the clock signal supplied from the fourth terminal therein and a clock distribution circuit for generating a clock signal supplied to said output circuit are activated using the first voltage as an operating voltage.

12. The semiconductor integrated circuit device according to claim 10, wherein said input circuit is activated based on the first voltage.

13. The semiconductor integrated circuit device according to claim 10, wherein each of a logic unit included in said output circuit and said level shift circuit comprises a logic-in level shift circuit, said logic-in level shift circuit comprising, a pair of first and second N channel MOSFETs which complementarily perform a switching operation according to the signal to be outputted produced from said internal circuit, and first and second P channel MOSFETs provided between the drains of the first and second N channel MOSFETs and the first voltage supplied from the first terminal and whose gates and drains are electrically cross-connected to one another; and a third N channel MOSFET which receives the timing signal at the gate thereof and is electrically connected to one of the pair of N channel MOSFETS, the drain of said one N channel MOSFET being electrically connected to an output terminal, and a third P channel MOSFET electrically connected to one of the cross-connected P channel MOSFETS, the drain of said one P channel MOSFET being electrically connected to the output terminal.

14. A semiconductor integrated circuit device, comprising:

an output circuit activated in response to a first source voltage; and an internal circuit activated in response to a second source voltage lower than the first source voltage, said output circuit including, a pair of first and second N channel MOSFETs which complementarily perform a switching operation according to a signal produced by said internal circuit, first and second P channel MOSFETs provided between the drains of the first and second N channel MOSFETs and a terminal supplied with the first source voltage and whose gates and drains are electrically cross-connected to one another, and an output terminal; and a third N channel MOSFET which receives a timing signal of the first source voltage level at the gate thereof and is electrically series-connected to one of the pair of N channel MOSFETS, the drain of said one N channel MOSFET being electrically connected to the output terminal, and a third P channel MOSFET which receives the timing signal at the gate thereof and is electrically parallel-connected to one of the cross-connected P channel MOSFETS, the drain of said one P channel MOSFET being electrically connected to the output terminal.

15. A semiconductor integrated circuit device, comprising:

an output circuit activated in response to a first source voltage; and an internal circuit activated in response to a second source voltage lower than the first source voltage, said output circuit including, a pair of first and second N channel MOSFETs which complementarily perform a switching operation according to a signal produced by said internal circuit, first and second P channel MOSFETs provided between the drains of the first and second N channel MOSFETs and a terminal supplied with the first source voltage, and an output terminal; and a third N channel MOSFET which receives a timing signal of the first source voltage level at the gate thereof and is electrically parallel-connected to one of the pair of N channel MOSFETS, the drain of said one N channel MOSFET being electrically connected to the output terminal, and a third P channel MOSFET which receives the timing signal at the gate thereof and is electrically series-connected to one of the cross-connected P channel MOSFETS, the drain of said one P channel MOSFET being electrically connected to the output terminal.

* * * * *